(12) United States Patent
Akizuki et al.

(10) Patent No.: US 9,841,486 B2
(45) Date of Patent: Dec. 12, 2017

(54) DETECTION CALIBRATION CIRCUIT AND TRANSMISSION APPARATUS

(71) Applicant: Panasonic Intellectual Property Management Co., Ltd., Osaka (JP)

(72) Inventors: Taiji Akizuki, Miyagi (JP); Masaki Kanemaru, Tokyo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 215 days.

(21) Appl. No.: 14/714,235

(22) Filed: May 15, 2015

(65) Prior Publication Data

US 2015/0338495 A1 Nov. 26, 2015

(30) Foreign Application Priority Data

May 21, 2014 (JP) .................................. 2014-105337
Feb. 25, 2015 (JP) .................................. 2015-035042

(51) Int. Cl.
*H04B 1/04* (2006.01)
*G01R 35/00* (2006.01)
(Continued)

(52) U.S. Cl.
CPC ....... *G01R 35/005* (2013.01); *G01R 19/0084* (2013.01); *H02J 5/005* (2013.01);
(Continued)

(58) Field of Classification Search
None
See application file for complete search history.

(56) References Cited

U.S. PATENT DOCUMENTS

2002/0127990 A1* 9/2002 Bollenbeck .......... H03G 3/3047
455/293
2004/0198301 A1* 10/2004 Rozenblit .............. H03G 3/004
455/343.1
(Continued)

FOREIGN PATENT DOCUMENTS

JP 2005-229535 8/2005
JP 2006-013753 1/2006

OTHER PUBLICATIONS

Partial European Search Report dated Oct. 6, 2015, for corresponding EP Application No. 15168381.0-1810, 6 pages.

*Primary Examiner* — Tuan T Lam
(74) *Attorney, Agent, or Firm* — Seed IP Law Group LLP

(57) ABSTRACT

A detection calibration circuit includes a first distributor distributing a high frequency input signal, an amplifier amplifying the first high frequency output signal of the first distributor, a second distributor distributing the amplified first high frequency output signal of the first distributor, a reference signal generator outputting a reference signal in accordance with a switchable reference voltage, a switcher selecting a third high frequency output signal of the second distributor or a reference signal of the reference signal generator and outputting the selected signal, a detector detecting the third high frequency output signal of the second distributor or the reference signal of the reference signal generator from the switcher, a sensitivity switcher adjusting a sensitivity for an output signal of the detector, and a calibration control circuit adjusting a detection gain of an input signal of the detector and an input-output sensitivity for an output signal of the detector.

9 Claims, 10 Drawing Sheets

(51) Int. Cl.
*G01R 19/00* (2006.01)
*H02J 5/00* (2016.01)
*H03G 3/30* (2006.01)

(52) U.S. Cl.
CPC ............ *H03G 3/3036* (2013.01); *H04B 1/04* (2013.01); *H04B 1/0458* (2013.01); *H04B 1/0475* (2013.01); *H04B 1/0483* (2013.01); *H04B 2001/045* (2013.01)

(56) References Cited

U.S. PATENT DOCUMENTS

| | | | |
|---|---|---|---|
| 2004/0198465 A1* | 10/2004 | Nation | H04M 1/60 455/573 |
| 2005/0287966 A1 | 12/2005 | Yoshimi et al. | |
| 2008/0139145 A1 | 6/2008 | Behzad | |
| 2012/0007580 A1 | 1/2012 | Kim | |
| 2012/0014423 A1 | 1/2012 | Mirzaei et al. | |
| 2013/0027129 A1* | 1/2013 | Langer | H04B 1/0458 330/127 |
| 2013/0034139 A1* | 2/2013 | Khlat | H03F 1/0227 375/224 |
| 2016/0028500 A1* | 1/2016 | Iino | H03F 3/189 455/226.2 |

* cited by examiner

DETECTION CALIBRATION CIRCUIT AND TRANSMISSION APPARATUS

BACKGROUND

1. Technical Field

The present disclosure relates to a detection calibration circuit that calibrates the power of a transmission signal and a transmission apparatus.

2. Description of the Related Art

In recent years, for wireless communication with high-speed transmission, a high-frequency band (for example, a frequency band of some hundreds MHz such as a millimeter wave band) is used in one channel to secure the band of a modulation signal and perform higher-speed transmission. Furthermore, for wireless communication with high-speed transmission over a long distance, the signal level needs to be maintained constant between a transmission apparatus and a reception apparatus to stably maintain the quality of the high-speed communication.

In the transmission apparatus, a power control circuit that detects power by using a detection circuit and adjusts a gain of an amplification circuit is used so that the power of a transmission signal is maintained constant regardless of an external perturbations (for example, a temperature fluctuation and a power supply fluctuation). For example, because the gain characteristic of a transistor used in a detection circuit is insufficient in a high frequency region such as a millimeter wave band, fluctuations in the gain characteristic due to the temperature, the power source, and aging are increased. Therefore, in the detection circuit, variations in the input-output characteristic are increased, whereby an error is generated in the output voltage of the detection circuit (hereinafter, referred to as "detected output voltage").

Furthermore, because the input control range of the detection circuit is narrow in a high-frequency band, when variations in the input-output characteristic of the detection circuit are great, the input voltage level of a high frequency signal to be input deviates from the input signal range and the detected output voltage becomes inaccurate.

As a related art for reducing variations in an input-output characteristic of a detection circuit, a transmission power control circuit described in Japanese Patent No. 4304296 is proposed, for example. Furthermore, as a related art for suppressing variations in an input-output characteristic of a detection circuit due to aging, a transmission power detection circuit described in Japanese Unexamined Patent Application Publication No. 2006-13753 is proposed, for example. The details of each of the documents mentioned above will be described later with reference to FIG. 9(A) and FIG. 9(B).

SUMMARY

With the structures disclosed in Japanese Patent No. 4304296 and Japanese Unexamined Patent Application Publication No. 2006-13753 mentioned above, when a high frequency signal (for example, a microwave and a millimeter wave) is used, a sufficient gain characteristic cannot be obtained for a transistor used in the detection circuit. There have been cases where the detection accuracy of the detection circuit is insufficient due to temperature fluctuations, power supply fluctuations, and individuality variations, for example.

One non-limiting and exemplary embodiment provides a detection calibration circuit and a transmission apparatus that suppress fluctuations in the detected output voltage of a high frequency signal even when a temperature fluctuation, a power supply fluctuation, or aging is generated.

In one general aspect, the techniques disclosed here feature a detection calibration circuit that includes a first distributor, a first amplifier, a second distributor, a reference signal generator, a switcher, a detector, a sensitivity switcher, and a calibration control circuit. The first distributor distributes a first high frequency input signal into a first high frequency signal and a second high frequency signal. The first amplifier amplifies the first high frequency signal. The second distributor distributes the amplified first high frequency signal further into a third high frequency signal and a fourth high frequency signal. The reference signal generator uses the second high frequency signal to generate a reference signal in accordance with a predetermined switchable reference voltage. The switcher selects the third high frequency signal or the reference signal of the reference signal generator. The detector outputs a detection signal obtained by detecting the selected signal. The sensitivity switcher adjusts an input-output sensitivity for the detection signal. The calibration control circuit adjusts a detection gain of the detector and an input-output sensitivity for the detection signal.

According to the present disclosure, even when a temperature fluctuation, a power supply fluctuation, or aging is generated, fluctuations in the detected output of a high frequency signal can be reduced and deterioration of the detection characteristic can be suppressed.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Background Leading to the Contents of the Respective Embodiments)

Figure 9:
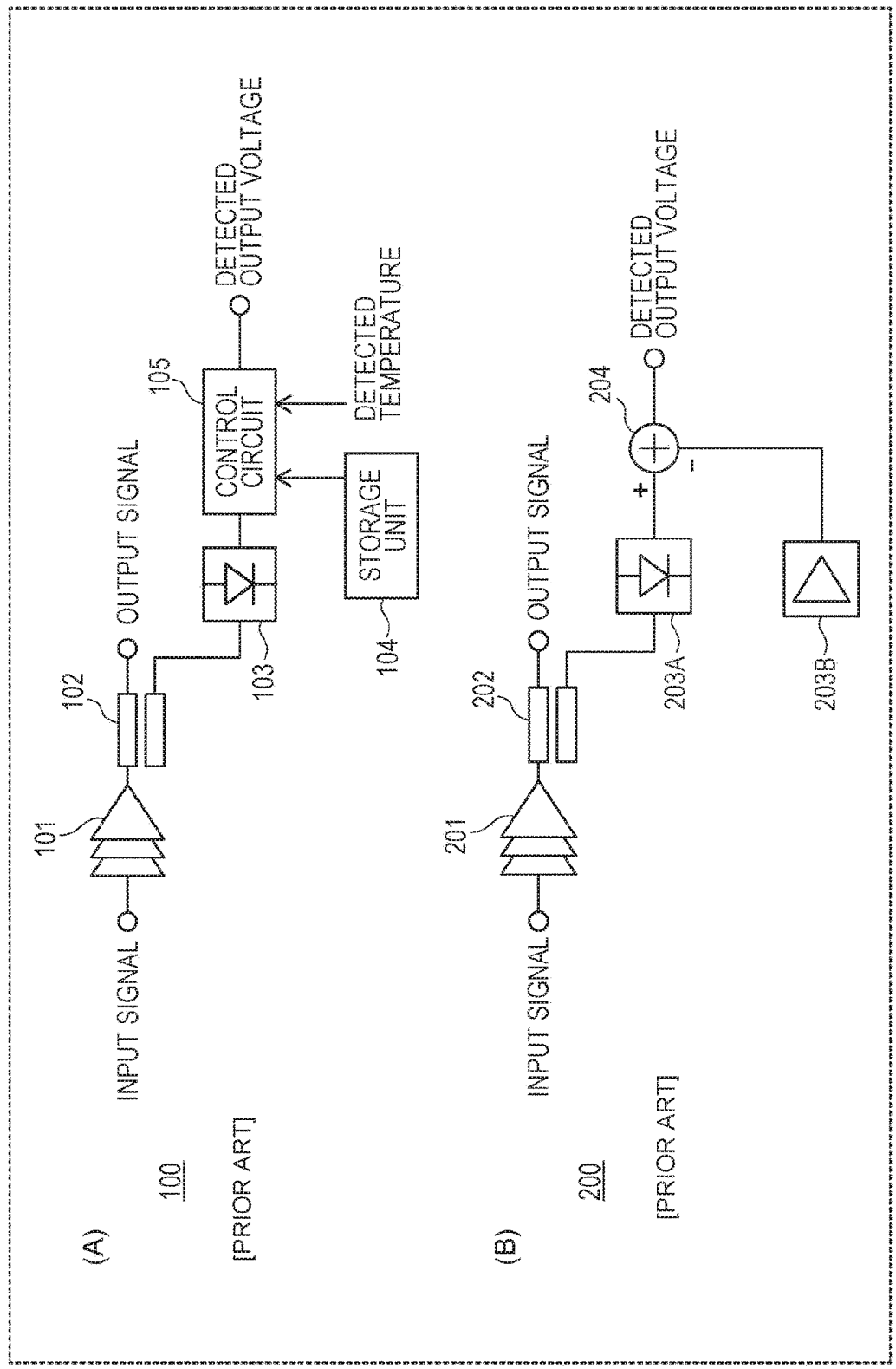
FIG. 9 includes a circuit diagram illustrating the internal structure of a transmission power control circuit in a first conventional example and a circuit diagram illustrating the internal structure of a transmission power detection circuit in a second conventional example.

Before the contents of the respective embodiments of a detection calibration circuit and a transmission apparatus according to the present disclosure are described, the background leading to the contents of the respective embodiments will be described below with reference to FIG. 9(A) and FIG. 9(B). FIG. 9(A) is a circuit diagram illustrating the internal structure of a transmission power control circuit 100 in a first conventional example. FIG. 9(B) is a circuit diagram illustrating the internal structure of a transmission power detection circuit 200 in a second conventional example.

The transmission power control circuit 100 disclosed in Japanese Patent No. 4304296 illustrated in FIG. 9(A) includes an amplification circuit 101, a coupler 102, a detection circuit 103, a storage unit 104, and a control circuit 105. In the transmission power control circuit 100, an input signal of which the power has been amplified in the amplification circuit 101 is distributed into two types of signals in the coupler 102. One type of signals are output to a post stage (not illustrated) and the other type of signals are input to the detection circuit 103.

The detection circuit 103 detects an input signal and outputs a signal of a detected output voltage as a detection result to the control circuit 105. The control circuit 105 adds an offset correction voltage value previously retained in the storage unit 104 to the detected output voltage and outputs the value obtained by the addition. At this point, the offset correction voltage value represents the offset amount of a voltage value in accordance with fluctuations in the temperature or the power supply voltage. With this, the transmission power control circuit 100 illustrated in FIG. 9(A) suppresses variations in the input-output characteristic (gain characteristic) of the detection circuit 103 even when the temperature or the power supply voltage fluctuates.

However, in the transmission power control circuit 100 illustrated in FIG. 9(A), the offset amount once retained in the storage unit 104 does not fluctuate. Therefore, when the input-output characteristic of the detection circuit 103 is deteriorated and changed due to aging, for example, errors of the detected output voltage are increased and require measures.

Furthermore, the gain characteristic and the input-output sensitivity characteristic of the detection circuit 103 are not adjusted. Therefore, in a state in which the gain characteristic of a transistor constructing the detection circuit 103 cannot be obtained sufficiently, the input signal range of a high frequency signal (for example, a millimeter wave signal) may be narrowed in the detection circuit 103.

This is because in the detection circuit 103, when a fluctuation is generated in the temperature or the power supply, the input signal range that can be detected by the detection circuit 103 is displaced due to a gain fluctuation and the input-output sensitivity of the detection circuit 103 is increased, whereby the input signal range is narrowed.

With this structure, in the detection circuit 103, there are some cases where the input voltage of a high frequency signal deviates from the input signal range of the detection circuit 103 and the detection voltage is not output.

The transmission power detection circuit 200 illustrated in FIG. 9(B) includes an amplification circuit 201, a coupler 202, a detection circuit 203A, a dummy amplifier 203B, and a synthetic circuit 204. In the transmission power detection circuit 200, an input signal of which the power has been amplified in the amplification circuit 201 is distributed into two types of signals in the coupler 202. One type of signals are output to a post stage (not illustrated) and the other type of signals are input to the detection circuit 203A.

The detection circuit 203A detects an input signal and outputs a signal of a detected output voltage as a detection result to the synthetic circuit 204. The dummy amplifier 203B uses a transistor of the same type as that of the transistor constructing the detection circuit 203A to output an offset voltage to the synthetic circuit 204. The synthetic circuit 204 outputs a detected output voltage being a synthetic wave obtained by subtracting the offset voltage of the dummy amplifier 203B from the detected output voltage of the detection circuit 203A.

With this structure, in the transmission power detection circuit 200, when the input-output characteristic (gain characteristic) of the detection circuit 203A fluctuates due to fluctuations in the temperature or the power supply including aging, the output (offset voltage) of the dummy amplifier 203B similarly fluctuates. Each of the fluctuation amounts of the detected output voltage of the detection circuit 203A and the offset voltage of the dummy amplifier 203B is thus cancelled in the synthetic circuit 204, whereby a stable detected output voltage can be obtained.

However, in the transmission power detection circuit 200 illustrated in FIG. 9(B), the gain characteristic and the input-output sensitivity characteristic of the detection circuit 203A are not adjusted. Therefore, similarly to the case of the transmission power control circuit 100 illustrated in FIG. 9(A), when a fluctuation is generated in the temperature or the power supply, the input signal range that can be detected by the detection circuit 203A is displaced due to a gain fluctuation and the input-output sensitivity of the detection circuit 203A is increased, whereby the input signal range is narrowed. Therefore, there have been some cases where the input voltage of a high frequency signal deviates from the input signal range of the detection circuit 203A and the detection voltage is not output.

Furthermore, in the transistor used in the detection circuit 203A and the dummy amplifier 203B, a relative error of the gain characteristic is superimposed on the detected output voltage. Therefore, in the transmission power detection circuit 200, when a high frequency signal (for example, a millimeter wave) is used, the output of the detected output voltage becomes inaccurate due to a variation caused by the relative error.

Based on the background described above, each embodiment below describes an example of a detection calibration circuit and a transmission apparatus that suppress fluctuations in the detected output voltage of a high frequency signal even when a temperature fluctuation, a power supply fluctuation, or aging is generated, with reference to the drawings.

Embodiment 1

Figure 1:
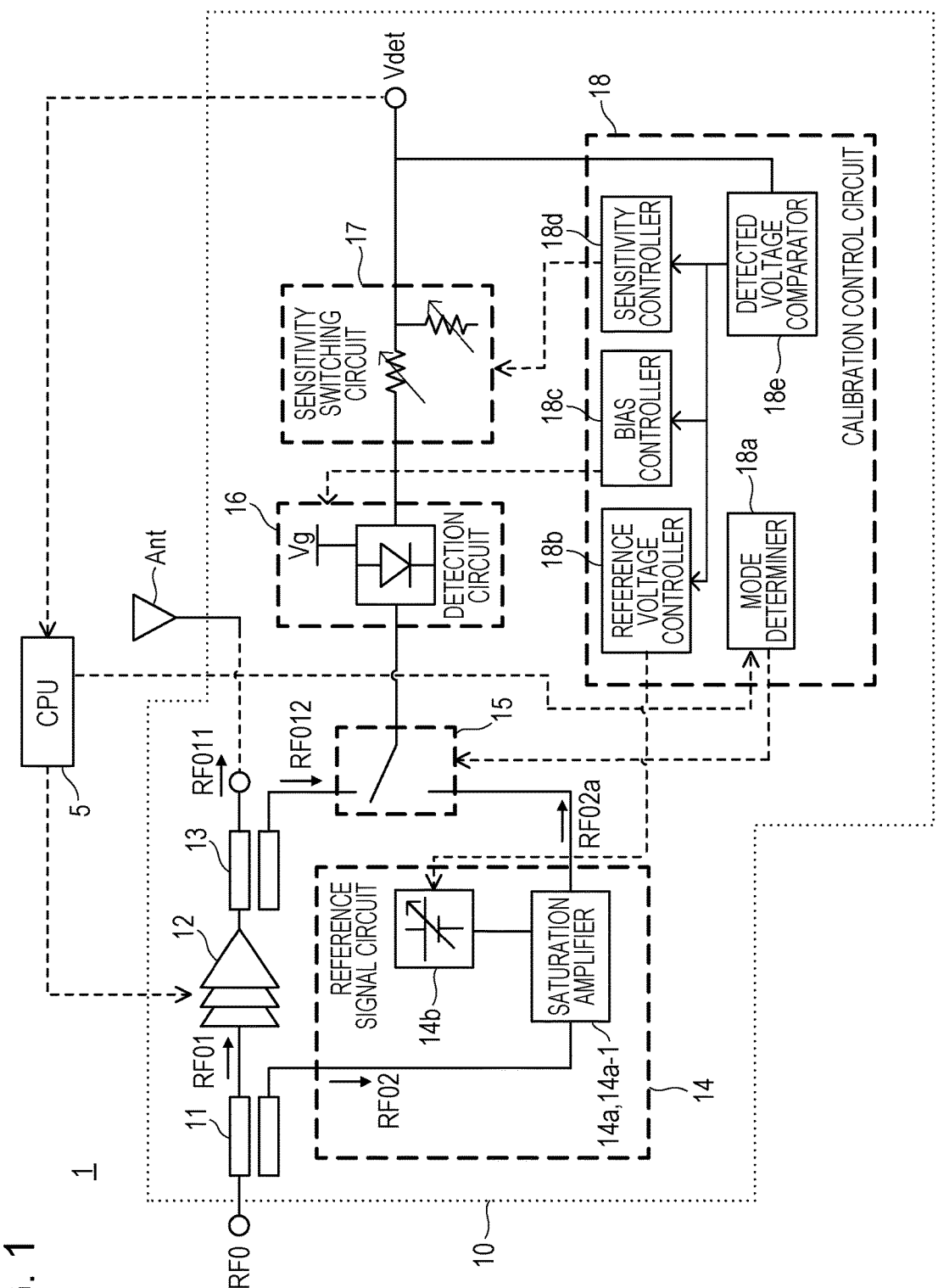
FIG. 1 is a circuit diagram illustrating the internal structure of a detection calibration circuit according to Embodiment 1.

FIG. 1 is a circuit diagram illustrating the internal structure of a detection calibration circuit 10 according to Embodiment 1. A transmission apparatus 1 illustrated in FIG. 1 includes a central processing unit (CPU) 5, a detection calibration circuit 10, and a transmission antenna Ant. Furthermore, the detection calibration circuit 10 illustrated in FIG. 1 includes a coupler 11, an amplification circuit 12, a coupler 13, a reference signal circuit 14, a selector switch 15, a detection circuit 16, a sensitivity switching circuit 17, and a calibration control circuit 18.

To an input terminal of the detection calibration circuit 10 illustrated in FIG. 1, a high frequency signal (for example, a millimeter wave) RF0 generated in a quadrature modulator (not illustrated) of the transmission apparatus 1 is input, for example.

The CPU 5 controls an operation performed by the transmission apparatus 1. For example, the CPU 5 generates a control signal for adjusting the gain of the amplification circuit 12 in accordance with a detected output voltage Vdet of the detection calibration circuit 10 and outputs the generated control signal to the amplification circuit 12. Furthermore, the CPU 5 switches the detection calibration circuit 10 to a calibration mode or a detection mode, and further generates a control signal for switching to either mode and outputs the generated control signal to the calibration control circuit 18. The control signal from the CPU 5 is input to a mode determiner 18a of the calibration control circuit 18.

The coupler 11 as an example of the first distributor is constructed with a directional coupler, for example. The coupler 11 distributes the high frequency signal RF0 input to the input terminal of the detection calibration circuit 10 into two types of high frequency signals RF01 and RF02, for example, and outputs the high frequency signals RF01 and RF02. The high frequency signal RF02 generated by distribution performed by the coupler 11 is input to the reference signal circuit 14.

To the amplification circuit 12 as an example of an amplifier, the high frequency signal RF01 generated by distribution performed by the coupler 11 is input, and the gain of the amplification circuit 12 is adjusted in accordance with the control signal from the CPU 5. The amplification circuit 12 amplifies the high frequency signal RF01 in accordance with the initial value of the gain or the value of the gain adjusted in accordance with the control signal from the CPU 5, and outputs the amplified high frequency signal RF01 to the coupler 13.

The coupler 13 as an example of the second distributor is constructed with a directional coupler, for example. The coupler 13 distributes the high frequency signal RF01 amplified by the amplification circuit 12 into two types of high frequency signals RF011 and RF012, for example, and outputs the high frequency signals RF011 and RF012. The high frequency signal RF011 generated by distribution performed by the coupler 13 is transmitted from the transmission antenna Ant.

The reference signal circuit 14 as an example of the reference signal generator includes a saturation amplifier 14a-1 or a saturation amplifier 14a, and a reference voltage switcher 14b. The saturation amplifier 14a-1 or the saturation amplifier 14a receives the high frequency signal RF02 and outputs a reference (voltage) signal RF02a in accordance with a reference power supply voltage Vref supplied from the reference voltage switcher 14b to the selector switch 15.

Figure 2:
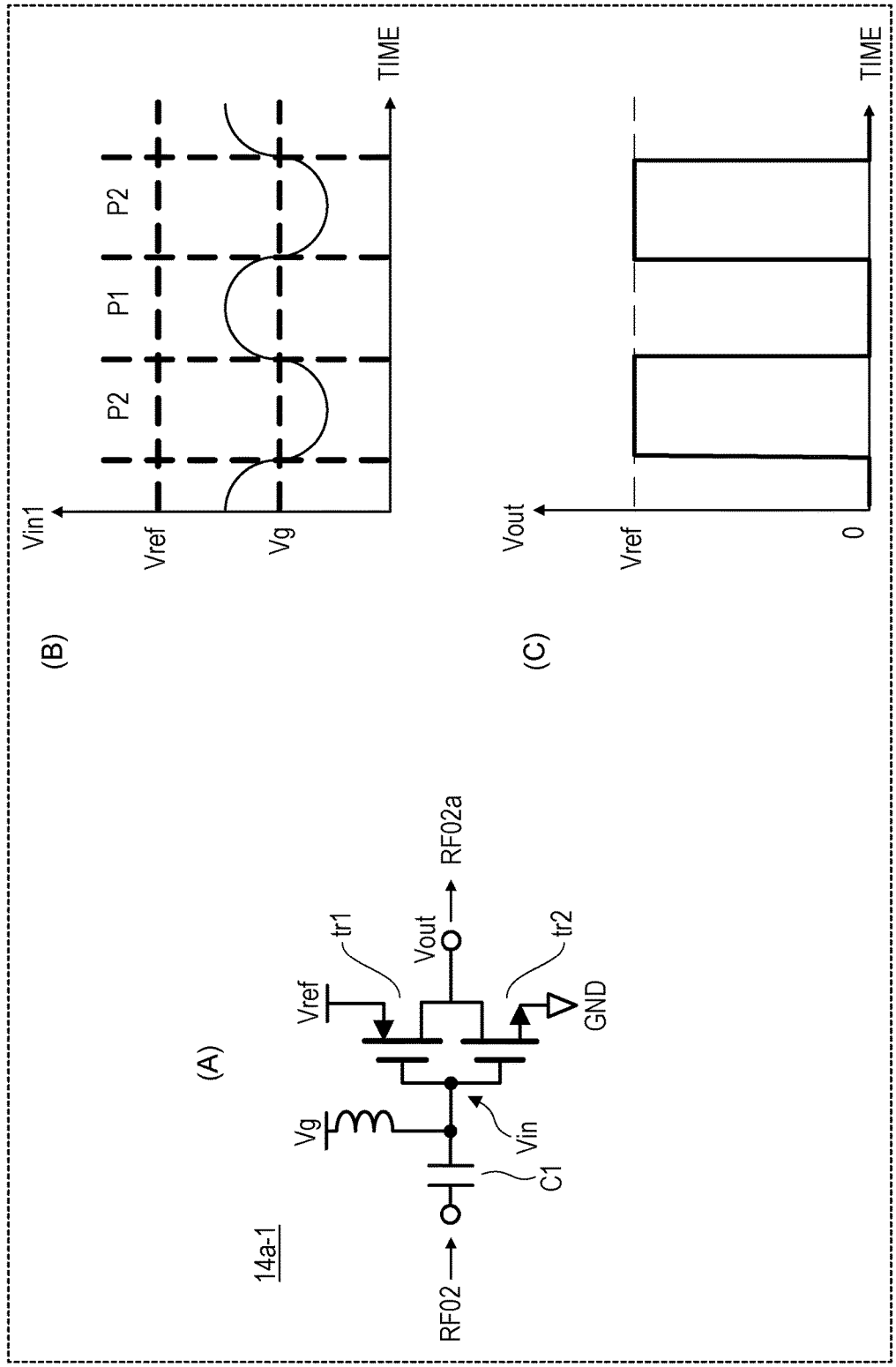
FIG. 2 includes a diagram illustrating a first example of the circuit structure of a saturation amplifier, a diagram illustrating an example of a waveform of an input signal to transistors, and a diagram illustrating an example of a waveform of an output signal of the saturation amplifier.

The saturation amplifier 14a-1 will now be described with reference to FIG. 2(A), FIG. 2(B), and FIG. 2(C). FIG. 2(A) is a diagram illustrating a first example of the circuit structure of the saturation amplifier. FIG. 2(B) is a diagram illustrating an example of a waveform of an input signal to transistors. FIG. 2(C) is a diagram illustrating an example of a waveform of an output signal of the saturation amplifier 14a-1 illustrated in FIG. 2(A).

The saturation amplifier 14a-1 illustrated in FIG. 2(A) performs a push-pull operation in a low frequency band. The high frequency signal RF02 that has been input to the saturation amplifier 14a-1 is input to the gate terminals of a p-channel metal-oxide-semiconductor (pMOS) transistor tr1 and an n-channel metal-oxide-semiconductor (nMOS) transistor tr2, which have a bias voltage of Vg, via the DC cut capacitor C1. The source terminal of the pMOS transistor tr1 and the source terminal of the nMOS transistor tr2 are connected to the output side of the saturation amplifier 14a-1. To the drain terminal of the pMOS transistor tr1, the reference power supply voltage Vref is supplied. The drain terminal of the nMOS transistor tr2 is connected to a ground potential (GND potential, 0 V).

To simplify the description below, it is defined that the pMOS transistor tr1 and the nMOS transistors tr2, tr3, and tr4 that are used in the saturation amplifiers 14a-1 and 14a are operated with the same bias voltage Vg.

In FIG. 2(B), with respect to a voltage Vin of the high frequency signal RF02 input to the gate terminals of the pMOS transistor tr1 and the nMOS transistor tr2, when the voltage Vin has an amplitude in a region P1 and a region P2 centered on the bias voltage Vg, the nMOS transistor tr2 is turned ON and the pMOS transistor tr1 is turned OFF in the region P1. The nMOS transistor tr2 is thus operated with the pMOS transistor tr1 serving as a high impedance load. Furthermore, the output signal (reference (voltage) signal) of the saturation amplifier 14a-1 is set to the GND potential (0 V).

By contrast, in the region P2, the pMOS transistor tr1 is turned ON, and the nMOS transistor tr2 is turned OFF. The pMOS transistor tr1 is thus operated with the nMOS transistor tr2 serving as a high impedance load. Furthermore, the output signal (reference (voltage) signal) of the saturation amplifier 14a-1 is set to the reference power supply voltage Vref.

The output signal (reference (voltage) signal: voltage Vout) of the saturation amplifier 14a-1 is thus a reference (voltage) signal RF02a of a rectangular waveform having an amplitude of the reference power supply voltage Vref from the reference voltage switcher 14b, regardless of external factors (for example, a temperature fluctuation, a power supply fluctuation, and aging) (See FIG. 2(C)).

Furthermore, the reference voltage switcher 14b supplies a plurality of predetermined and different types of reference power supply voltages Vref to the saturation amplifier 14a-1 in accordance with a voltage control signal from a reference voltage controller 18b described later. With this, the saturation amplifier 14a-1 can output the reference (voltage) signal RF02a of a rectangular waveform having the amplitude of the different types of reference power supply voltage Vref in accordance with the reference power supply voltage Vref supplied from the reference voltage switcher 14b.

As the frequency band of the frequency of the reference (voltage) signal RF02a becomes closer to that of the high frequency signal RF012 detected, the detected output voltage error between the level of the reference (voltage) signal and the level of the high frequency signal RF012 due to the frequency band difference is decreased, whereby the detection accuracy is improved. It should be noted that in the structure of the saturation amplifier 14a-1 illustrated in FIG. 2(A), the pMOS transistor tr1 is used, and the operation frequency thereof is thus from 5 GHz to 10 GHz approximately.

By contrast, by using the saturation amplifier 14a illustrated in FIG. 3(A), for example, the operation frequency of the reference signal circuit 14 can be improved up to a millimeter wave band. Next, the saturation amplifier 14a will be described with reference to FIG. 3(A), FIG. 3(B), FIG. 3(C), and FIG. 3(D). FIG. 3(A) is a diagram illustrating a second example of the circuit structure of the saturation amplifier. FIG. 3(B) is a diagram illustrating an example of a waveform of an input signal to one transistor. FIG. 3(C) is a diagram illustrating an example of a waveform of an input signal to the other transistor. FIG. 3(D) is a diagram illustrating an example of a waveform of an output signal of the saturation amplifier 14a illustrated in FIG. 3(A).

The saturation amplifier 14a illustrated in FIG. 3(A) performs a push-pull operation in a high frequency band. The high frequency signal RF02 that has been input to the saturation amplifier 14a is converted from a one-phase signal into a differential signal (positive-phase high frequency signal and negative-phase high frequency signal) in a transformer trns via a DC cut capacitor C1.

An output signal (positive-phase high frequency signal and negative-phase high frequency signal) of the transformer trns is input to gate terminals of two nMOS transistors tr2a and tr2b, which have a bias voltage of Vg. Each of the source terminals of the nMOS transistors tr2a and tr2b is connected to the output side of the saturation amplifier 14a. To the drain terminal of the nMOS transistor tr2a, the reference power supply voltage Vref is supplied. The drain terminal of the nMOS transistor tr2b is connected to a ground potential (GND potential, 0 V).

In FIG. 3(B) and FIG. 3(C), when the voltages Vin1 of the output (positive-phase high frequency signal) of the transformer trns is a positive voltage in a region P1 centered on the bias voltage Vg, and the voltages Vin2 of the output (negative-phase high frequency signal) of the transformer trns is a positive voltage in a region P2 centered on the bias voltage Vg, the nMOS transistors tr2a and tr2b are never turned ON at the same time because the region P1 and the region P2 alternately appear.

In the region P1 in FIG. 3(B), the nMOS transistors tr2b is turned ON and the nMOS transistor tr2a is turned OFF. The nMOS transistors tr2b is thus operated with the nMOS transistor tr2a serving as a high impedance load. Furthermore, the output signal (reference (voltage) signal) of the saturation amplifier 14a is set to the GND potential (0 V) in the voltage region P1 in FIG. 3(D).

By contrast, in the region P2 in FIG. 3(B), the nMOS transistors tr2a is turned ON and the nMOS transistor tr2b is turned OFF. The nMOS transistors tr2a is thus operated with the nMOS transistor tr2b serving as a high impedance load. Furthermore, the output signal (reference (voltage) signal) of the saturation amplifier 14a is set to the reference power supply voltage Vref in the voltage region P2 in FIG. 3(D).

The output signal (reference (voltage) signal: Vout) of the saturation amplifier 14a is thus a reference (voltage) signal RF02a of a rectangular waveform having an amplitude of the reference power supply voltage Vref from the reference voltage switcher 14b, regardless of external factors (for example, a temperature fluctuation, a power supply fluctuation, and aging) even when a high frequency signal (for example, a millimeter wave of 60 GHz or higher) is used (See FIG. 3(D)).

In the case of a conventional amplifier, because the gain thereof is insufficient at a millimeter frequency, the rectangular wave in FIG. 3(D) for an output signal thereof does not extend from the GND to the reference power supply voltage Vref. More specifically, because the conventional amplifier is not in a saturated operation but in a linear operation, the amplitude of the output signal in FIG. 3(D) fluctuates in accordance with fluctuations in the gain due to external factors.

Figure 3:
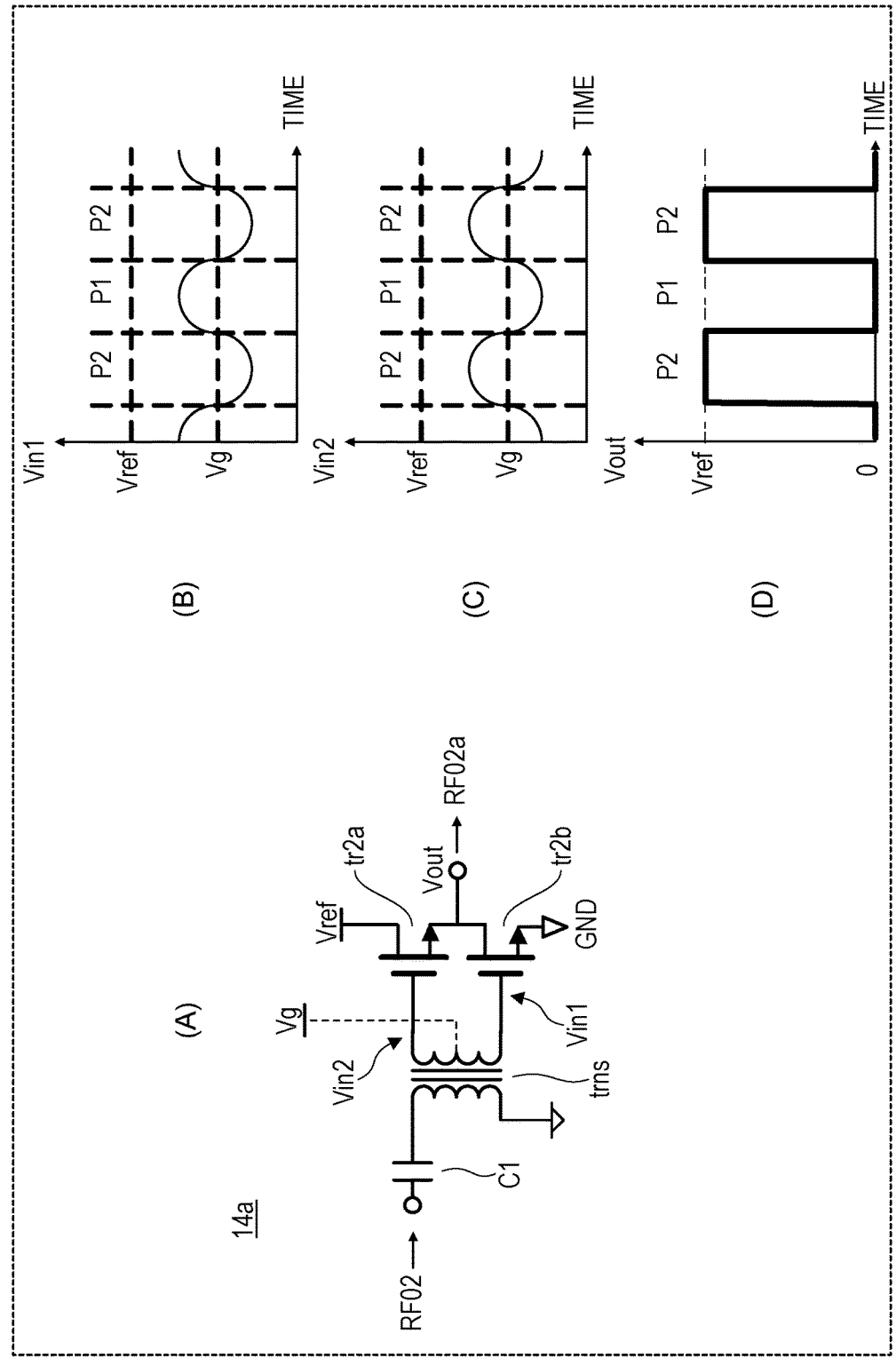
FIG. 3 includes a diagram illustrating a second example of the circuit structure of the saturation amplifier, a diagram illustrating an example of a waveform of an input signal to one transistor, a diagram illustrating an example of a waveform of an input signal to the other transistor, and a diagram illustrating an example of a waveform of an output signal of the saturation amplifier.

By contrast, in the case of the saturation amplifier in FIG. 3, because the gain thereof is sufficient at a millimeter frequency, the amplitude of the output signal in FIG. 3(D) extends from the GND to the reference power supply voltage Vref. The amplitude of the output signal in FIG. 3(D) thus does not fluctuate even if the gain fluctuates due to external factors.

Similarly, the reference voltage switcher 14b supplies a plurality of predetermined and different types of reference power supply voltages Vref to the saturation amplifier 14a in accordance with a voltage control signal from the reference voltage controller 18b described later. With this, the saturation amplifier 14a can output the reference (voltage) signal RF02a of a rectangular waveform having the amplitude of the different types of reference power supply voltage Vref in accordance with the reference power supply voltage Vref supplied from the reference voltage switcher 14b.

The selector switch 15 as an example of the switcher switches between the high frequency signal RF012 from the coupler 13 and the reference (voltage) signal RF02a from the reference signal circuit 14 in accordance with a switching control signal from the mode determiner 18a described later, that is, selects either the high frequency signal RF012 or the reference (voltage) signal RF02a, and outputs the selected signal to the detection circuit 16.

Specifically, when the transmission apparatus 1 is in the calibration mode, the selector switch 15 outputs the reference (voltage) signal RF02a from the reference signal circuit 14 to the detection circuit 16 in accordance with the switching control signal from the mode determiner 18a described later. When the transmission apparatus 1 is in the detection mode, the selector switch 15 outputs the high frequency signal RF012 from the coupler 13 to the detection circuit 16.

The calibration mode is a mode for adjusting (calibrating) a detection gain and an input-output sensitivity of the detection circuit 16 in the detection calibration circuit 10. The detection mode is a mode for detecting the high frequency signal RF012 from the coupler 13 in the detection calibration circuit 10. The mode of the transmission apparatus 1 is determined by the CPU 5, and a mode control signal output by the CPU 5 is input to the mode determiner

18a. In accordance with the mode control signal output by the CPU 5, the mode determiner 18a generates the switching control signal indicating either the calibration mode or the detection mode and outputs the generated switching control signal to the selector switch 15.

The detection circuit 16 as an example of a detector detects the reference (voltage) signal RF02a from the reference signal circuit 14 or the high frequency signal RF012 from the coupler 13 and outputs a signal (detection signal) of the detected output voltage as a detection result to the sensitivity switching circuit 17. It should be noted that the detection circuit 16 converts the high frequency signal RF012 or the reference (voltage) signal RF02a into a direct current (DC) signal. However, the detection circuit 16 may be a detection circuit using a diode, for example, in a band of a high frequency signal (for example, a millimeter wave of 60 GHz or higher), and may be a detection circuit using an nMOS transistor that can adjust the detection gain.

Figure 4:
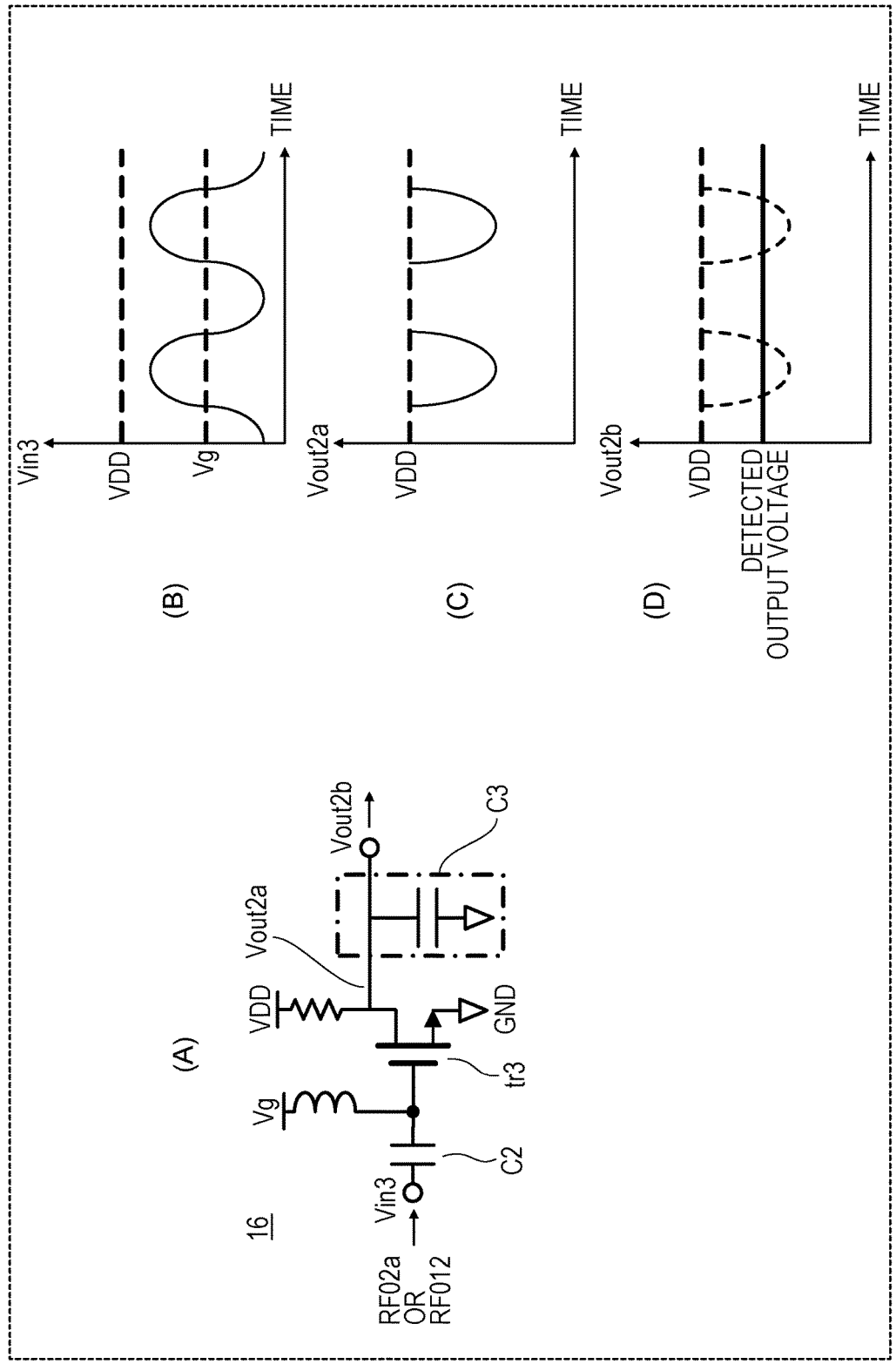
FIG. 4 includes a diagram illustrating an example of the circuit structure of a detection circuit, a diagram illustrating an example of a waveform of a signal input to the detection circuit, a diagram illustrating an example of a waveform of an output signal before smoothing, and a diagram illustrating an example of a waveform of an output signal after smoothing.

The detection circuit 16 will now be described with reference to FIG. 4(A), FIG. 4(B), FIG. 4(C), and FIG. 4(D). FIG. 4(A) is a diagram illustrating an example of the circuit structure of the detection circuit. FIG. 4(B) is a diagram illustrating an example of a waveform of a signal input to the detection circuit 16. FIG. 4(C) is a diagram illustrating an example of a waveform of an output signal before smoothing. FIG. 4(D) is a diagram illustrating an example of a waveform of an output signal after smoothing.

In the detection circuit 16 illustrated in FIG. 4(A), the reference (voltage) signal RF02a or the high frequency signal RF012 to be input is input to the gate terminal of the nMOS transistor tr3 of the bias voltage Vg via a DC cut capacitor C2. In FIG. 4(B), the voltage Vin3 of the reference (voltage) signal RF02a or the high frequency signal RF012 that is input to the detection circuit 16 periodically varies centered on the bias voltage Vg.

The source terminal of the nMOS transistor tr3 is connected to the ground potential (GND potential, 0 V). To the drain terminal of the nMOS transistor tr3, a predetermined power supply voltage VDD is supplied. In FIG. 4(C), a voltage Vout2a of an output signal of the nMOS transistor tr3 is a signal (half-wave signal) higher than the voltage Vin3 of the reference (voltage) signal RF02a or the high frequency signal RF012 illustrated in FIG. 4(B). In FIG. 4(D), a voltage Vout2b of a signal obtained by smoothing the output signal of the nMOS transistor tr3 with a smoothing capacitor C3 is a detected output voltage being a DC voltage value.

The detection circuit 16 thus can adjust the amplitude of the half-wave signal in accordance with a bias control signal from a bias controller 18c described later and adjust a detection gain in the detection circuit 16 (that is, an input/output signal voltage ratio in the detection circuit 16). Accordingly, the detection circuit 16 can adjust the detection gain by adjusting the bias voltage Vg in accordance with a bias control signal from a bias controller 18c regardless of external factors (for example, a temperature fluctuation, a power supply fluctuation, and aging), whereby a desired input-output characteristic DSR1 can be obtained (see FIG. 5(A)).

Figure 5:
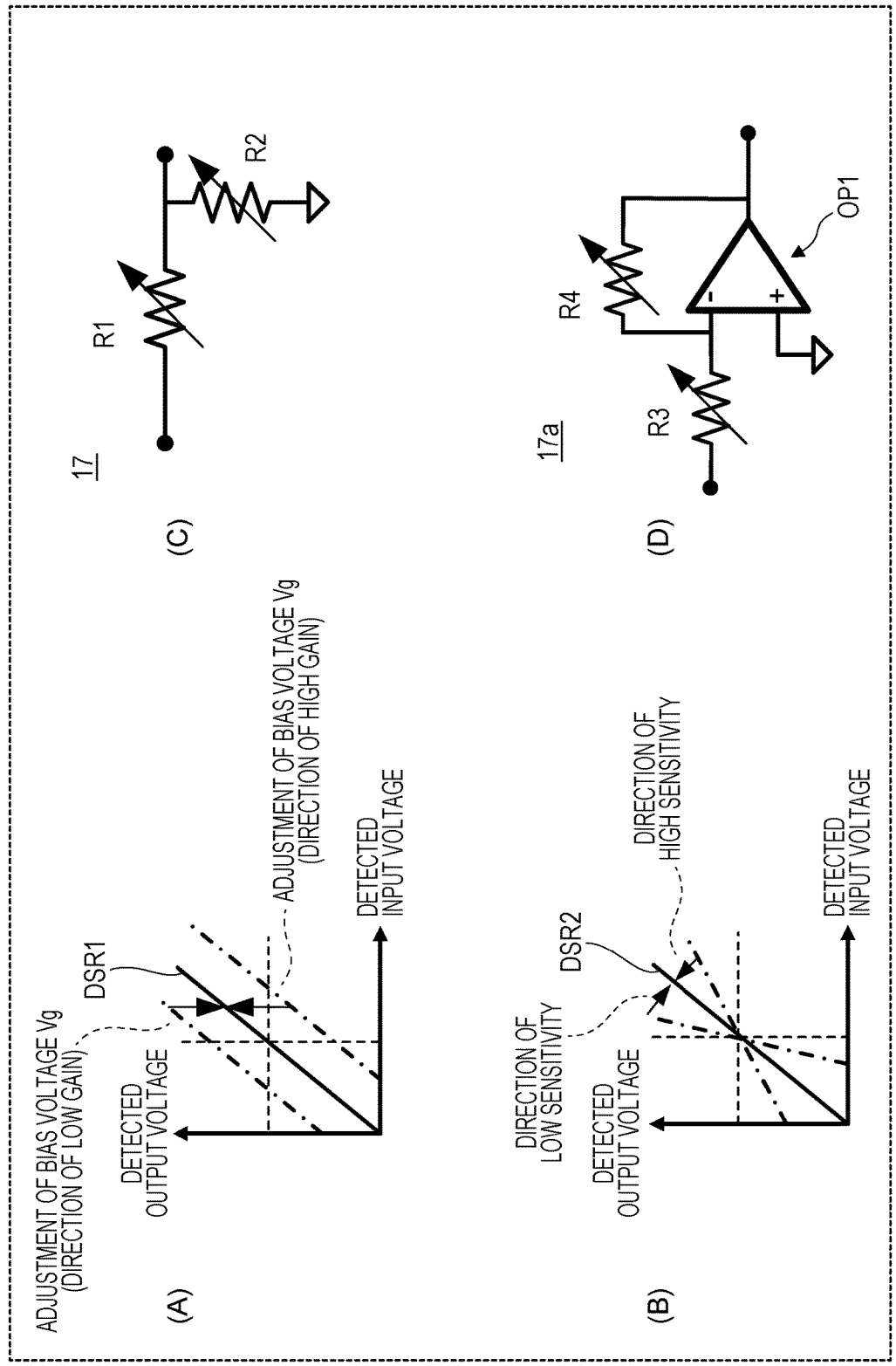
FIG. 5 includes a diagram illustrating an example of a detection gain in accordance with the relation between a detected input voltage and a detected output voltage, a diagram illustrating an example of the sensitivity for a detected output voltage corresponding to a detected input voltage, a diagram illustrating an example of a sensitivity switching circuit, and a diagram illustrating another example of the sensitivity switching circuit.

FIG. 5(A) is a diagram illustrating an example of a detection gain in accordance with the relation between a detected input voltage and a detected output voltage. The input-output characteristic DSR1 is a characteristic of a detected output voltage with respect to a detected input voltage for obtaining a desired detection gain in the detection circuit 16 even when an external factor (for example, a temperature fluctuation, a power supply fluctuation, and aging) is generated.

The sensitivity switching circuit 17 as an example of the sensitivity switcher adjusts the input-output sensitivity for an output signal (more specifically, a signal of the detected output voltage) of the detection circuit 16 in accordance with the sensitivity control signal from a sensitivity controller 18d described later (see FIG. 5(B)). FIG. 5(B) is a diagram illustrating an example of the sensitivity for a detected output voltage corresponding to a detected input voltage. An output of the sensitivity switching circuit 17 is detected in the CPU 5 as a detected output voltage Vdet in the detection calibration circuit 10.

At this point, the sensitivity switching circuit 17 can adjust the input-output sensitivity by switching the voltage dividing resistance ratio using a variable resistances R1 and R2 illustrated in FIG. 5(C), for example. Furthermore, similarly to the adjustment of the detection gain in the detection circuit 16, even when an external factor (for example, a temperature fluctuation, a power supply fluctuation, and aging) is generated, the sensitivity switching circuit 17 can obtain a desired input-output characteristic DSR2 with respect to the input-output sensitivity by switching the input-output sensitivity of the detection circuit 16 when the detection gain fluctuates. FIG. 5(C) is a diagram illustrating an example of the sensitivity switching circuit.

It should be noted that the output signal of the saturation amplifier 14a or 14a-1 serves as a reference input signal for checking the deviation amount from input and output signals of the input-output characteristics DSR1 and DSR2 in FIG. 5(A) and FIG. 5(B). Outputs (detected input voltages) from the saturation amplifier 14a or 14a-1 at two or more points are thus used to adjust the detection circuit 16 and the sensitivity switching circuit 17 such that the detected output voltage corresponds to the input-output characteristics DSR1 and DSR2.

With this, the detection calibration circuit 10 can adjust the detection gain and the input-output sensitivity in the detection circuit 16 even when the detected output voltage Vdet fluctuates due to occurrence of an external factor (for example, a temperature fluctuation, a power supply fluctuation, or aging), compared with the transmission power control circuit 100 and the transmission power detection circuit 200 described above, which are illustrated in FIG. 9(A) and FIG. 9(B) as conventional examples. Accordingly, in the detection calibration circuit 10, even when a high frequency signal (for example, a millimeter wave) is used, for which the input signal range is narrow and the input-output sensitivity is high in the detection circuit 16, the signal input to the detection circuit 16 does not deviate from the input signal range, whereby a detected output voltage with less variations can be obtained.

Furthermore, as another example of the sensitivity switching circuit, the circuit structure illustrated in FIG. 5(D) may be used that can switch the voltage dividing resistance ratio using an operational amplifier OP1 and variable resistances R3 and R4. FIG. 5(D) is a diagram illustrating another example of the sensitivity switching circuit. In a sensitivity switching circuit 17a illustrated in FIG. 5(D), because the operational amplifier has a function as an output buffer, a stable detected output voltage can be supplied to a load (not illustrated) connected to a post stage of the sensitivity switching circuit 17a.

The calibration control circuit 18 as an example of the calibration control circuit includes the mode determiner 18a, the reference voltage controller 18b, the bias controller 18c, the sensitivity controller 18d, and a detected voltage comparator 18e.

In accordance with the mode control signal output by the CPU 5, the mode determiner 18a generates the switching control signal indicating either the calibration mode or the detection mode of the transmission apparatus 1 and outputs the generated switching control signal to the selector switch 15.

The reference voltage controller 18b generates a voltage control signal for switching to a plurality of different reference power supply voltages Vref based on the output of the detected voltage comparator 18e described later and outputs the generated voltage control signal to the reference voltage switcher 14b. The ranges and the differentials (resolutions) of the reference power supply voltages Vref are determined in advance such that the reference power supply voltages Vref are in the input signal range of the detection circuit 16 as two or more input signals even when the detected output voltage of the detection circuit 16 fluctuates due to occurrence of an external factor (for example, a temperature fluctuation, a power supply fluctuation, or aging). The reference voltage switcher 14b supplies the reference power supply voltage Vref in accordance with the voltage control signal to the saturation amplifiers 14a and 14a-1.

The bias controller 18c generates a bias control signal for switching the bias voltage Vg of the detection circuit 16 based on the output of the detected voltage comparator 18e described later and outputs the generated bias control signal to the detection circuit 16. The detection circuit 16 is operated in accordance with the bias voltage Vg corresponding to the bias control signal.

The sensitivity controller 18d generates a sensitivity control signal for switching the input-output sensitivity of the detection circuit 16 based on the output of the detected voltage comparator 18e described later and outputs the generated sensitivity control signal to the sensitivity switching circuit 17. The voltage dividing resistance ratio is adjusted in accordance with the sensitivity control signal, whereby the input-output sensitivity of the detection circuit 16 is adjusted.

The detected voltage comparator 18e uses the detected output voltage Vdet for each of two or more reference power supply voltages Vref switched by the reference voltage controller 18b to calculate the detection gain and the input-output sensitivity of the detection circuit 16.

The detected voltage comparator 18e retains a setting value of the detection gain and the input-output sensitivity for obtaining a desired input-output characteristic in the detection circuit 16. The detected voltage comparator 18e compares each of the calculated values of the detection gain and the input-output sensitivity of the detection circuit 16 and each of the setting values of the detection gain and the input-output sensitivity of the detection circuit 16. The detected voltage comparator 18e controls the reference power supply voltage Vref and the voltage dividing resistance ratio in sensitivity switching circuit 17 such that errors (differentials) of the calculated values and the setting values, which are comparison results, are minimized.

With the structure described above, the detection calibration circuit 10 can adjust the detection gain and the input-output sensitivity of the detection circuit 16 in accordance with the detected output voltage for each of a plurality of different reference power supply voltages.

The detection calibration circuit 10 thus can obtain desired input-output characteristics DSR1 and DSR2 of the detection circuit 16 regardless of external factors (for example, a temperature fluctuation, a power supply fluctuation, and aging), whereby dispersion errors of the detection circuit 16 itself can be reduced and deterioration of the detection accuracy can be suppressed.

Furthermore, even when an external factor (for example, a temperature fluctuation, a power supply fluctuation, and aging) is generated, the detection calibration circuit 10 can obtain a desired detected output voltage Vdet when the high frequency signal RF012 is detected in the detection mode by using the detection gain and the input-output sensitivity of the detection circuit 16 which have been obtained in the calibration mode, whereby variations of the power of the high frequency signal RF011 transmitted from the transmission antenna Ant can be reduced. The power of the high frequency signal RF011 thus can be maintained constant.

Embodiment 2

In Embodiment 2, a detection calibration circuit 10A provided on a transmission apparatus 1A outputting high frequency signals at the same time from a plurality of transmission branches as in beam forming, for example, will be described. In the transmission apparatus 1A corresponding to beam forming, the larger the number of the transmission branches, the directivity of the radiation pattern of the high frequency signals radiated from the transmission antenna becomes narrower. The transmission apparatus 1A is thus highly effective as a beam forming device.

However, when the power of the high frequency signals vary among the transmission branches, the radiation pattern of the high frequency signals are disturbed, and due to fluctuations in the detected output voltage when an external factor (for example, a temperature fluctuation, a power supply fluctuation, and aging) is generated, the variation in the power of the high frequency signals among the transmission branches exceeds a desired value. Therefore, there is a need to maintain the power constant.

Figure 6:
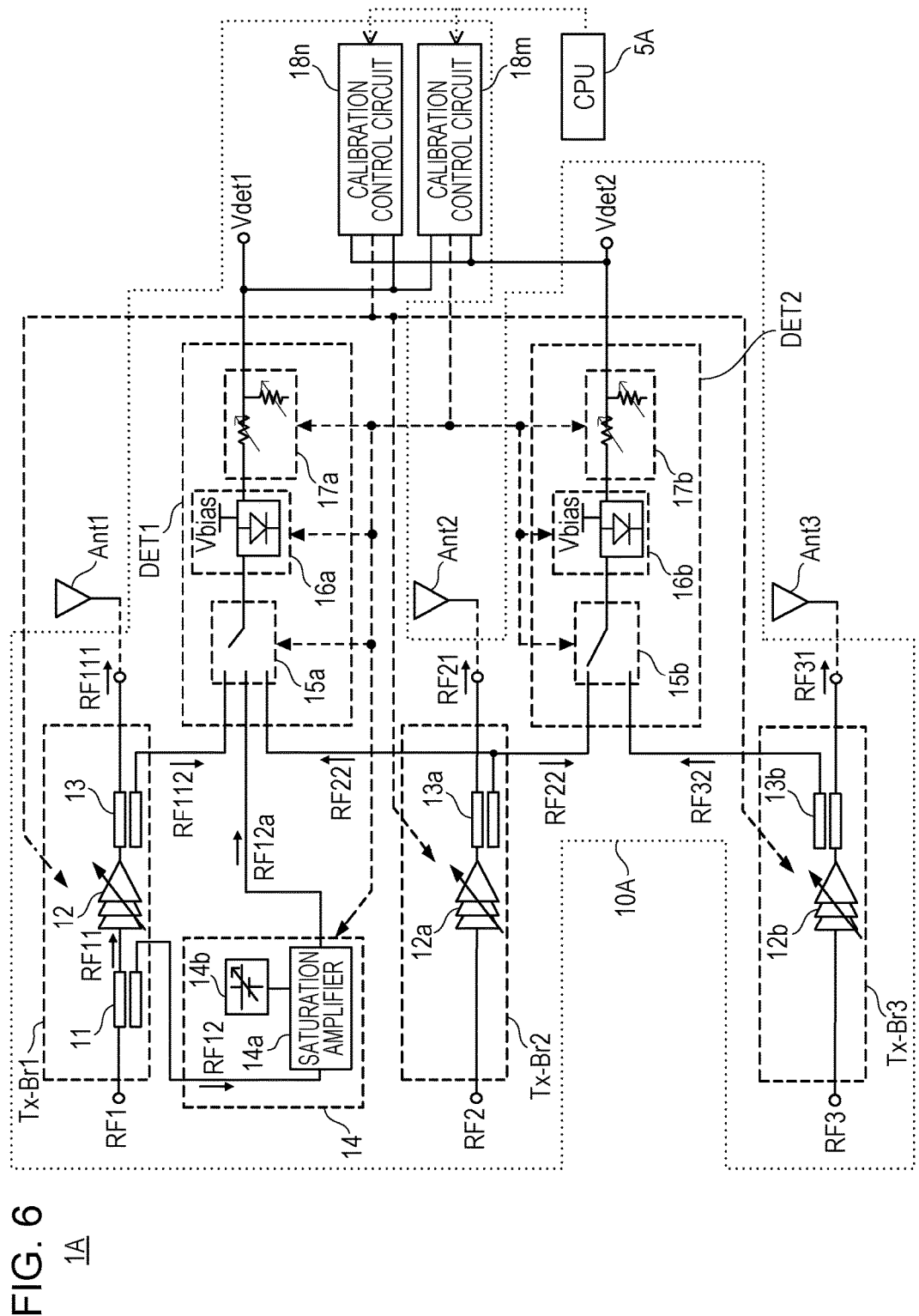
FIG. 6 is a circuit diagram illustrating the internal structure of a detection calibration circuit according to Embodiment 2.

FIG. 6 is a circuit diagram illustrating the internal structure of the detection calibration circuit 10A according to Embodiment 2. The transmission apparatus 1A illustrated in FIG. 6 includes a CPU 5A, the detection calibration circuit 10A, a transmission antenna Ant1 connected to a transmission branch Tx-Br1, a transmission antenna Ant2 connected to a transmission branch Tx-Br2, and a transmission antenna Ant3 connected to a transmission branch Tx-Br3.

Furthermore, the detection calibration circuit 10A illustrated in FIG. 6 includes the transmission branches Tx-Br1, Tx-Br2, and Tx-Br3, a reference signal circuit 14, detection circuit groups DET1 and DET2, and calibration control circuits 18m and 18n. It should be noted in the description of various sections illustrated in FIG. 6, components having the same structure and performing the same operation as in the sections in FIG. 1 are denoted with the same reference characters and the explanations thereof are simplified or omitted, except for those having any different features. Furthermore, in FIG. 6, the detection calibration circuit 10A having three types of transmission branches, for example, will be described, for ease of explanation. To each of the transmission branches Tx-Br1, Tx-Br2, and Tx-Br3, high frequency signals RF1, RF2, and RF3 are input.

The transmission branch Tx-Br1 includes a coupler 11, an amplification circuit 12, and a coupler 13. The high frequency signal RF11 from the coupler 11 is input to the amplification circuit 12 to be amplified. The high frequency signal RF12 from the coupler 11 is input to a saturation amplifier 14a in the reference signal circuit 14. The high frequency signal RF111 from the coupler 13 is radiated from the transmission antenna Ant1. The high frequency signal RF112 from the coupler 13 is input to a selector switch 15a. A reference (voltage) signal RF12a from the saturation amplifier 14a is input to the selector switch 15a.

The transmission branch Tx-Br2 includes an amplification circuit 12a and a coupler 13a. The high frequency signal RF2 is amplified in the amplification circuit 12a and distributed into two types of high frequency signals RF21 and RF22 in the coupler 13a. The high frequency signal RF21 from the coupler 13a is radiated from the transmission antenna Ant2. The high frequency signal RF22 from the coupler 13a is input to the selector switches 15a and 15b.

The transmission branch Tx-Br3 includes an amplification circuit 12b and a coupler 13b. The high frequency signal RF3 is amplified in the amplification circuit 12b and distributed into two types of high frequency signals RF31 and RF32 in the coupler 13b. The high frequency signal RF31 from the coupler 13b is radiated from the transmission antenna Ant3. The high frequency signal RF32 from the coupler 13b is input to the selector switch 15b.

The detection circuit group DET1 includes the selector switch 15a, a detection circuit 16a, and a sensitivity switching circuit 17a. When the transmission apparatus 1A is in the calibration mode, the selector switch 15a outputs the reference (voltage) signal RF12a from the reference signal circuit 14 to the detection circuit 16a. When the transmission apparatus 1A is in the detection mode, the selector switch 15a outputs the high frequency signal RF112 of the transmission branch Tx-Br1 to the detection circuit 16a and outputs the high frequency signal RF22 of the transmission branch Tx-Br2 to the detection circuit 16a.

At this point, the calibration control circuit 18m generates a switching control signal indicating either the calibration mode or the detection mode in accordance with a mode control signal output from the CPU 5A and outputs the generated switching control signal to each of the selector switches 15a and 15b, similarly to the calibration control circuit 18 in Embodiment 1.

Furthermore, the calibration control circuit 18n starts an operation after completion of adjustment of the detection gain and the input-output sensitivity of the detection circuit 16a for each reference (voltage) signal RF12a in the calibration control circuit 18m. The calibration control circuit 18n adjusts the gains of the amplification circuits 12, 12a, and 12b respectively in the transmission branches Tx-Br1, Tx-Br2, and Tx-Br3 such that the detected output voltages become the same that correspond to the high frequency signals RF111, RF21, and RF31 respectively from the transmission branches Tx-Br1, Tx-Br2, and Tx-Br3.

The operations performed by the transmission apparatus 1A in FIG. 6 will be described below.

First Operation: Adjusting the Detection Circuit Group DET1

Firstly, when the transmission apparatus 1A is in the calibration mode, the calibration control circuit 18m adjusts the detection gain and the input-output sensitivity of the detection circuit 16a for each reference (voltage) signal RF12a in the reference signal circuit 14, similarly to the calibration control circuit 18 in Embodiment 1.

It should be noted that the description of the adjustment of the detection gain and the input-output sensitivity in the calibration control circuit 18m is the same as in Embodiment 1 and thus omitted.

Second Operation: Setting Adjustment Results of the Detection Circuit Group DET1 to the Detection Circuit Group DET2

As the values of the detection gain and input-output sensitivity in the detection circuit 16b in the detection circuit group DET2 being another detection circuit group, the calibration control circuit 18m uses the same values as those of the detection gain and input-output sensitivity adjusted in the detection circuit group DET1.

In other words, the calibration control circuit 18m controls the bias voltage of the detection circuit 16b and the voltage dividing resistance ratio of the sensitivity switching circuit 17b such that the values of the detection gain and the input-output sensitivity in the detection circuit 16b in the detection circuit group DET2 become the same values as those of the detection gain and the input-output sensitivity adjusted in the detection circuit group DET1.

With this, the detection circuit group DET2 can obtain a detected output voltage range of the detected output voltage Vdet2 that is the same as the detected output voltage range of the detected output voltage Vdet1 of the detection circuit group DET1 even when an external factor (for example, a temperature fluctuation, a power supply fluctuation, and aging) is generated.

Third Operation: Detecting the High Frequency Signal RF112 in the Detection Circuit Group DET1

After the values of the detection gain and the input-output sensitivity of the detection circuit 16a are adjusted by the calibration control circuit 18m, the calibration control circuit 18n stores therein the value of output of the detection circuit group DET1 for the high frequency signal RF112 from the coupler 13 of the transmission branch Tx-Br1 (that is, the detected output voltage Vdet1).

Fourth Operation: Adjusting the Gain of the Amplification Circuit 12a Using the Detection Circuit Group DET1

The calibration control circuit 18n inputs the high frequency signal RF22 from the coupler 13a of the transmission branch Tx-Br2 to the selector switch 15a and adjusts the gain of the amplification circuit 12a of the transmission branch Tx-Br2 such that the value of the corresponding detected output voltage becomes the value of the output of the detection circuit group DET1 of the transmission branch Tx-Br1 (that is, the detected output voltage Vdet1).

With this, the power of the high frequency signal RF111 from the transmission branch Tx-Br1 and the power of the high frequency signal RF21 from the transmission branch Tx-Br2 are adjusted to be the same value.

Fifth Operation: Detecting the High Frequency Signal RF22 in the Detection Circuit Group DET2

After the gain of the amplification circuit 12a of the transmission branch Tx-Br2 is adjusted, the calibration control circuit 18n stores therein the value of the output of the detection circuit group DET2 for the high frequency signal RF22 from the coupler 13a of the transmission branch Tx-Br2 (that is, the detected output voltage Vdet2).

Sixth Operation: Adjusting the Gain of the Amplification Circuit 12b Using the Detection Circuit Group DET2

Firstly, the calibration control circuit 18n causes the selector switch 15b to output the high frequency signal RF32 from the coupler 13b of the transmission branch Tx-Br3 to the detection circuit 16b.

Next, the calibration control circuit 18n uses the detection gain and the input-output sensitivity of the detection circuit 16b that have been adjusted by the calibration control circuit 18m to adjust the gain of the amplification circuit 12b of the transmission branch Tx-Br3 such that the value of the detected output voltage corresponding to the high frequency signal RF32 from the coupler 13b of the transmission branch Tx-Br3 becomes the same as the value of the detected output voltage Vdet2.

With this, the power of the high frequency signal RF21 from the transmission branch Tx-Br2 and the power of the high frequency signal RF31 from the transmission branch Tx-Br3 are adjusted to be the same value.

If the number of the transmission branches becomes larger, the transmission apparatus 1A can similarly adjust the power of the output among each of the transmission branches (high frequency signal transmitted) to be the same value.

With the structure described above, in the detection calibration circuit 10A according to the present embodiment, the reference signal circuit 14 generating the reference (voltage) signal RF12a can be one signal, whereby dispersion errors of the reference (voltage) signal can be reduced compared with the case where a plurality of reference signal circuits 14 are used, the circuit structure can be simplified, and the circuit area can be reduced. Furthermore, because the detected output voltages corresponding to the high frequency signals input from two types of transmission branches are compared for each of the detection circuit groups DET1 and DET2, the influence of dispersion errors can be suppressed and the powers of the high frequency signals from the transmission branches Tx-Br1, Tx-Br2, and Tx-Br3 can be adjusted to be the same value even when the detected output values of the detection circuit groups DET1 and DET2 vary.

It should be noted that a separate reference signal circuit 14 may be provided in the detection circuit group DET2. By providing a reference signal circuit 14 in each detection circuit group DET, the adjustment period can be shortened.

Embodiment 3

In Embodiment 3, a detection calibration circuit 10B corresponding to a millimeter wave using a saturation amplifier 14c that is operated also in a low frequency band, unlike in Embodiment 1, will be described.

Figure 7:
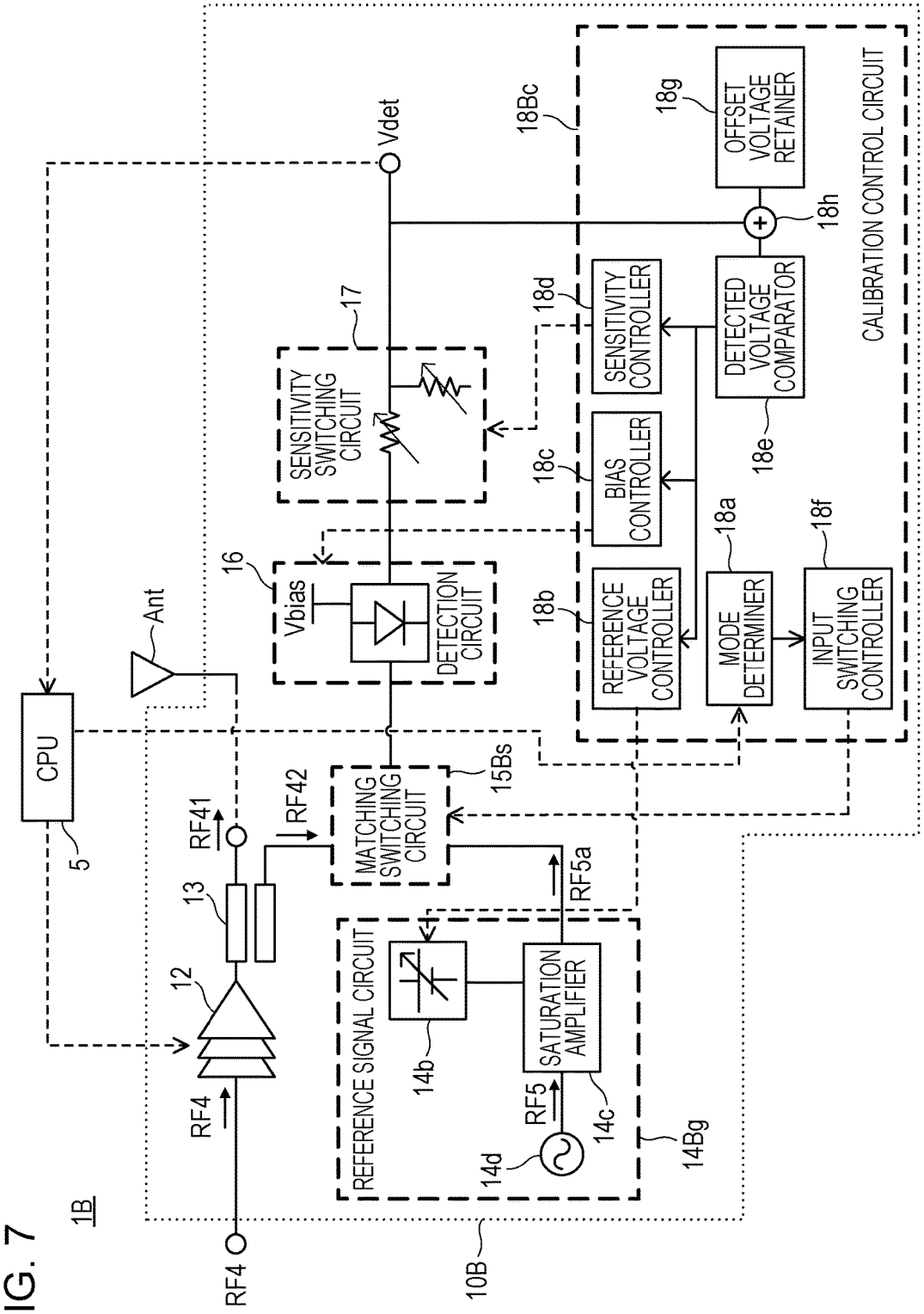
FIG. 7 is a circuit diagram illustrating the internal structure of a detection calibration circuit according to Embodiment 3.

FIG. 7 is a circuit diagram illustrating the internal structure of the detection calibration circuit 10B according to Embodiment 3. A transmission apparatus 1B illustrated in FIG. 7 includes a CPU 5, the detection calibration circuit 10B, and a transmission antenna Ant. Furthermore, the detection calibration circuit 10B illustrated in FIG. 7 includes an amplification circuit 12, a coupler 13, a reference signal circuit 14Bg, a matching switching circuit 15Bs, a detection circuit 16, a sensitivity switching circuit 17, and a calibration control circuit 18Bc. It should be noted in the description of various sections illustrated in FIG. 7, components having the same structure and performing the same operation as in the sections in FIG. 1 are denoted with the same reference characters and the explanations thereof are simplified or omitted, except for those having any different features.

In the detection calibration circuit 10B illustrated in FIG. 7, a high frequency signal RF4 is amplified in the amplification circuit 12 and distributed into two types in the coupler 13. A high frequency signal RF41 from the coupler 13 is radiated from the transmission antenna Ant. A high frequency signal RF42 from the coupler 13 is input to the matching switching circuit 15Bs.

The reference signal circuit 14Bg as an example of the reference signal generator includes a reference signal source 14d, the saturation amplifier 14c, and a reference voltage switcher 14b. It should be noted that the reference signal source 14d may not be provided inside the reference signal circuit 14Bg and may be a reference signal source provided inside the transmission apparatus 1B. The reference signal source 14d generates a local signal RF5 of which the frequency is in a frequency band (for example, 5 GHz to 10 GHz approximately) in which the saturation amplifier 14c can be operated and outputs the generated local signal RF5 to the saturation amplifier 14c.

The saturation amplifier 14c has the same structure as the saturation amplifier 14a-1 illustrated in FIG. 2(A) and the detailed explanation thereof is thus omitted. The saturation amplifier 14c receives the local signal RF5 from the reference signal source 14d and outputs a reference (voltage) signal RF5a to the matching switching circuit 15Bs. It should be noted that because the saturation amplifier 14c uses the pMOS transistor tr1 and the nMOS transistor tr2 illustrated in FIG. 2(A), in the detection calibration circuit 10B according to the present embodiment, the circuit structure of the reference signal circuit 14Bg can be simplified and the circuit area thereof can be reduced.

Furthermore, the upper limit frequency at which the saturation amplifier 14c can be operated is approximately 10 GHz at which the pMOS transistor tr1 illustrated in FIG. 2(A) can be operated. The lower limit frequency at which the saturation amplifier 14c can be operated is a frequency at which a smoothing capacitor C3 provided in the output stage of the detection circuit 16 can be operated and a high frequency signal that is input can be converted into a DC detected output voltage.

At this point, the capacity value of the smoothing capacitor C3 needs to be set in reverse proportion to the frequency of the high frequency signal that is input. Even if the capacity value of the smoothing capacitor C3 is dynamically switched in the calibration mode, for example, the capacity value is approximately 20 times higher in an actual layout. Accordingly, the lower limit frequency is approximately one-twentieth of the high frequency signal that is input.

When a high frequency signal (for example, a millimeter wave of 60 GHz or higher) is used, in the reference signal circuit 14Bg, the reference signal source 14d that generates a local signal having a frequency in a frequency band of 3 GHz to 10 GHz approximately is used, for example.

According to the present embodiment, the high frequency signal RF42 is input to the detection circuit 16 in the detection mode, and the reference (voltage) signal RF5a is input to the detection circuit 16 in the calibration mode. At this point, in the detection circuit 16, the operating frequency of the high frequency signal RF42 is approximately 10 times higher than the operating frequency of the reference (voltage) signal RF5a.

The matching switching circuit 15Bs adjusts impedance matching in accordance with the frequency of the high frequency signal RF42 as the detection mode or the frequency of the reference (voltage) single RF5a as the calibration mode, in accordance with the switching control signal from an input switching controller 18f described later, and thereby outputs the high frequency signal RF42 or the reference (voltage) signal RF5a to the detection circuit 16.

With this, the detection calibration circuit 10B uses the matching switching circuit 15Bs and thereby adjusts matching conditions in accordance with the high frequency signal RF42 or the reference (voltage) signal RF5a, whereby the structure of the selector switch 15 can be omitted, unlike in Embodiment 1. It should be noted that inside the matching switching circuit 15Bs, the selector switch 15 may be provided similarly to Embodiment 1.

Figure 8:
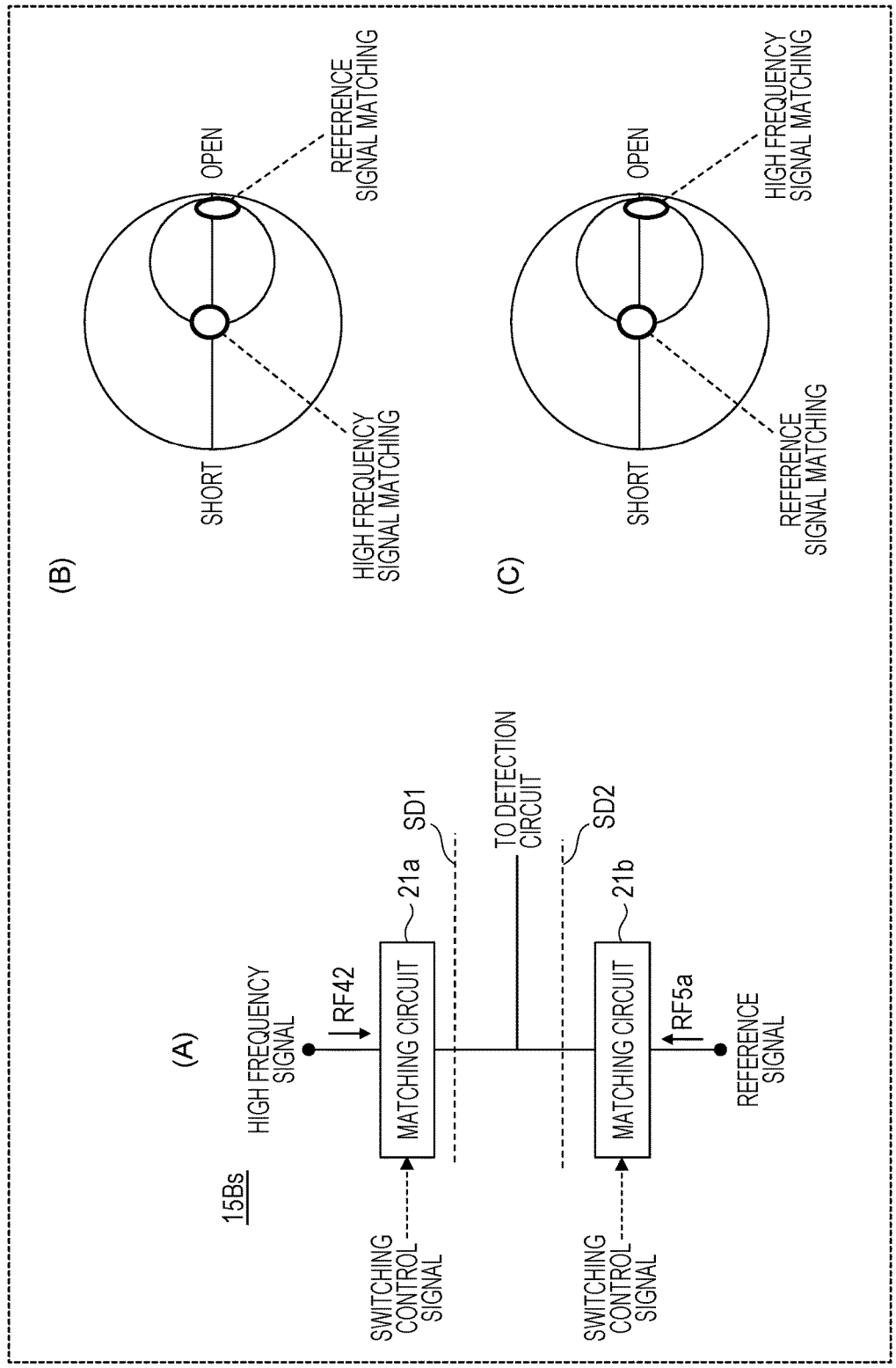
FIG. 8 includes a diagram illustrating an example of a matching switching circuit, an explanatory diagram illustrating an example of a Smith chart in which a high frequency signal is input to a detection circuit in the matching switching circuit, and an explanatory diagram illustrating an example of a Smith chart in which a reference (voltage) signal is input to the detection circuit in the matching switching circuit.

FIG. 8(A) is a diagram illustrating an example of the matching switching circuit 15Bs. FIG. 8(B) is an explanatory diagram illustrating an example of a Smith chart in which the high frequency signal RF42 is input to the detection circuit 16 in the matching switching circuit 15Bs. FIG. 8(C) is an explanatory diagram illustrating an example of a Smith chart in which the reference (voltage) signal RF5a is input to the detection circuit 16 in the matching switching circuit 15Bs.

In FIG. 8(A), in accordance with the switching control signal from the input switching controller 18f, the impedance matching of the high frequency signal RF42 input from a high frequency signal input terminal or the reference (voltage) signal RF5a input from a reference signal terminal is performed in a matching circuit 21a or a matching circuit 21b, and the high frequency signal RF42 or the reference (voltage) signal RF5a is input to the detection circuit 16.

The matching conditions of the matching circuit 21a and the matching circuit 21b will now be described with reference to the Smith charts illustrated in FIG. 8(B) and FIG. 8(C).

As the matching conditions for outputting the high frequency signal RF42 to the detection circuit 16, the matching switching circuit 15Bs adjusts the impedance matching at the frequency of the high frequency signal RF42 illustrated in FIG. 8(B) and implements a high impedance in the frequency band of the reference (voltage) signal RF5a (see the right side of the largest circle in FIG. 8(B): open). A high frequency signal is thus input to the detection circuit 16.

By contrast, as the matching conditions for outputting the reference (voltage) signal RF5a to the detection circuit 16, the matching switching circuit 15Bs adjusts the impedance matching at the frequency of the reference (voltage) signal RF5a illustrated in FIG. 8(C) and implements a high impedance in the frequency band of the high frequency signal RF42 (open). A reference signal is thus input to the detection circuit 16.

With these operations, the matching switching circuit 15Bs combines the output signals from the matching circuit 21a and the matching circuit 21b and outputs the combined signal to the detection circuit 16, whereby an isolation characteristic can be secured such that the high frequency signal RF42 and the reference (voltage) signal RF5a do not affect each other.

With this structure, in the detection calibration circuit 10B, the matching switching circuit 15Bs is used, whereby the selector switch 15 in Embodiment 1 can be omitted. Furthermore, the circuit of the detection calibration circuit 10B can be simplified and the circuit area of the detection calibration circuit 10B can be reduced.

The input switching controller 18f generates a switching control signal in accordance with the determination result of the mode determiner 18a (that is, the determination result indicating whether the transmission apparatus 1B is in the calibration mode or in the detection mode) and outputs the generated switching control signal to the matching switching circuit 15Bs.

The input switching controller 18f generates a switching control signal satisfying the matching conditions for outputting the high frequency signal RF42 to the detection circuit 16 in the detection mode and generates a switching control signal satisfying the matching conditions for outputting the reference (voltage) signal RF5a to the detection circuit 16 in the calibration mode, and outputs the generated switching control signal to the matching switching circuit 15Bs.

Furthermore, because the detection gain depends on the frequency band of the signal input to the detection circuit 16, the value of the detected output voltage Vdet output from the detection circuit 16 or the sensitivity switching circuit 17 depends on whether in the detection mode or in the calibration mode.

Therefore, in the calibration control circuit 18Bc, an offset voltage value corresponding to the difference between the detected output voltage in the detection mode and the detected output voltage in the calibration mode may be retained in advance in an offset voltage retainer 18g.

When the transmission apparatus 1B is in the calibration mode, an adder 18h adds the offset voltage value retained in the offset voltage retainer 18g to the detected output voltage Vdet from the detection circuit 16 and the sensitivity switching circuit 17 and outputs the value obtained by the addition to the detected voltage comparator 18e. With this, in the calibration control circuit 18Bc, the detection gain generated due to the difference in the frequencies of signals input to the detection circuit 16 can be appropriately corrected and the detection gain and the input-output sensitivity can be adjusted to be constant, similarly to in the case of the detection mode.

With the structure described above, in the calibration mode of the transmission apparatus 1B, the detection calibration circuit 10B according to the present embodiment can calibrate the detected output voltage Vdet in the calibration mode, similarly to the detection calibration circuit 10 in Embodiment 1, even when the reference signal circuit 14Bg is used that includes the saturation amplifier 14c (saturation amplifier 14a-1) of which the operating frequency is lower than that of the saturation amplifier 14a in the reference signal circuit 14 in Embodiment 1.

With this structure, in the detection calibration circuit 10B, effects similar to those of the detection calibration circuit 10 in Embodiment 1 can be obtained, and furthermore, the circuit can be simplified and the circuit area can be reduced compared with the detection calibration circuit 10.

Embodiment 4

In Embodiment 4, an input amplification circuit 19 will be described. Unlike in Embodiment 1, the input amplification circuit 19 (a second amplifier) provided for an input to a detection circuit 16 corresponds to switching between a saturation operation and a linear operation in accordance with the mode switching between the calibration mode and the detection mode.

Figure 10:
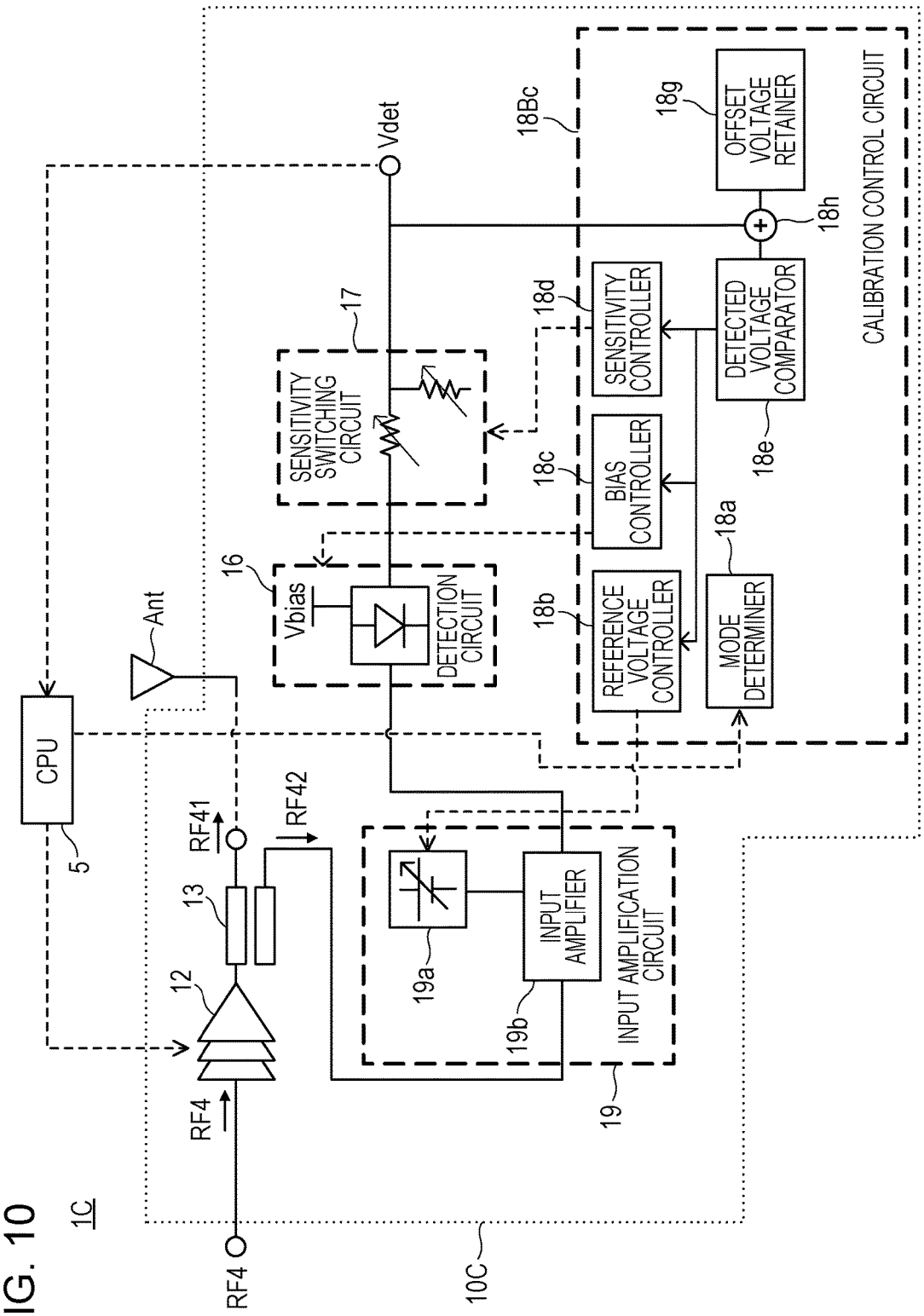
FIG. 10 is a circuit diagram illustrating the internal structure of a detection calibration circuit according to Embodiment 4.

FIG. 10 is a diagram illustrating the structure of the input amplification circuit according to Embodiment 4. A transmission apparatus 1C illustrated in FIG. 10 includes a CPU 5, a detection calibration circuit 10C, and a transmission antenna Ant. Furthermore, the detection calibration circuit 10C illustrated in FIG. 10 includes an amplification circuit 12, a coupler 13, the input amplification circuit 19, the detection circuit 16, a sensitivity switching circuit 17, and a calibration control circuit 18Bc. It should be noted in the description of various sections illustrated in FIG. 10, components having the same structure and performing the same operation as in the sections in FIG. 1 are denoted with the same reference characters and the explanations thereof are simplified or omitted, except for those having any different features.

In the detection calibration circuit 10C illustrated in FIG. 10, a high frequency signal RF4 (first amplifier) is distributed into two types in the coupler 13 after being amplified in the amplification circuit 12. A high frequency signal RF41 from the coupler 13 is radiated from the transmission antenna Ant. A high frequency signal RF42 from the coupler 13 is input to the input amplification circuit 19.

The input amplification circuit 19 includes an input amplifier 19b (high frequency amplification circuit) that amplifies the high frequency signal RF42 and a power supply voltage switcher 19a that switches the power supply voltage to be supplied to the input amplifier 19b. The input amplifier 19b is an amplifier that amplifies a high frequency signal similarly to the amplification circuit 12 and can adjust an output single voltage range from a linear operation to a saturation operation in accordance with the power supply voltage to be supplied.

The reference voltage controller 18b thus sets the power supply voltage of the power supply voltage switcher 19a high because the input amplifier 19b is in a linear operation in the detection mode, and sets the power supply voltage of the power supply voltage switcher 19a low because the input amplifier 19b is in a saturation operation in the calibration mode. Furthermore, the reference voltage controller 18b can generate output signals of a plurality of saturation operation voltages by using a plurality of power supply voltage values in the calibration mode.

With this, in the detection calibration circuit 10C, a reference signal circuit 14 and a selector switch 15 can be omitted in the calibration mode of the transmission apparatus 1C. Furthermore, in the detection calibration circuit 10C, the power supply voltage switcher 19a sets a plurality of power supply voltages, whereby reference (voltage) signals of rectangular waveforms being a plurality of saturation operation voltages can be output as the output signals of the input amplification circuit 19. In other words, similarly to the detection calibration circuit 10 in Embodiment 1, the detection calibration circuit 10C can calibrate the detected output voltage Vdet in the calibration mode.

With this structure, in the detection calibration circuit 10C, the same effects as in the detection calibration circuit 10 in Embodiment 1 can be obtained, and furthermore, the circuit can be simplified and the circuit area can be reduced compared with the detection calibration circuit 10.

Various aspects of embodiments according to the present disclosure include those described below.

A detection calibration circuit according to a first aspect includes a first distributor, a first amplifier, a second distributor, a reference signal generator, a switcher, a detector, a sensitivity switcher, and a calibration control circuit. The first distributor distributes a first high frequency input signal into a first high frequency signal and a second high frequency signal. The first amplifier amplifies the first high frequency signal. The second distributor distributes the amplified first high frequency signal further into a third high frequency signal and a fourth high frequency signal. The reference signal generator uses the second high frequency signal to generate a reference signal in accordance with a switchable reference voltage. The switcher selects the third high frequency signal or the reference signal of the reference signal generator. The detector outputs a detection signal obtained by detecting the selected signal. The sensitivity switcher adjusts an input-output sensitivity for the detection signal. The calibration control circuit adjusts a detection gain of the detector and an input-output sensitivity for the detection signal.

A detection calibration circuit according to a second aspect is the detection calibration circuit according to the first aspect described above. The calibration control circuit further includes a bias controller that switches a bias voltage of the detector to one of a plurality of different bias voltages and a sensitivity controller that switches an input-output sensitivity for the detection signal in the sensitivity switcher to one of a plurality of input and output sensitivities.

A detection calibration circuit according to a third aspect is the detection calibration circuit according to the first aspect described above. The calibration control circuit further includes a reference voltage controller that switches a reference voltage of the reference signal generator to one of a plurality of reference voltages.

A detection calibration circuit according to a fourth aspect is the detection calibration circuit according to the third aspect described above. The calibration control circuit further includes a detected voltage comparator that calculates the detection gain and the input-output sensitivity corresponding to the reference signal for each of the reference voltages, that compares between each of setting values of the detection gain and the input-output sensitivity corresponding to a desired input-output characteristic of the detector and each of calculated values of the detection gain and the input-output sensitivity, and that adjusts the detection gain and the input-output sensitivity in accordance with comparison results.

A detection calibration circuit according to a fifth aspect is the detection calibration circuit according to the first aspect described above. The calibration control circuit further includes a mode determiner that determines either a detection mode for detecting the third high frequency signal or a calibration mode for adjusting the detection gain and the input-output sensitivity. The switcher selects the third high frequency signal in the calibration mode and selects the reference signal in the detection mode.

A detection calibration circuit according to a sixth aspect is the detection calibration circuit according to the first aspect described above. The reference signal generator includes a transformer that converts the second high frequency signal from a one-phase signal into a differential signal, a first transistor element that receives a first positive-phase high frequency output signal of the transformer with a gate terminal thereof and outputs the reference signal in accordance with the reference voltage supplied to a drain terminal thereof, and a second transistor element that receives a first negative-phase high frequency output signal of the transformer with a gate terminal thereof and has a source terminal connected to a source terminal of the first transistor element and a drain terminal grounded.

A detection calibration circuit according to a seventh aspect is the detection calibration circuit according to the first aspect described above. The reference signal generator includes a reference signal source that outputs a local signal having a frequency lower than the high frequency input signal, a third transistor element that receives a local signal from the reference signal source with a gate terminal thereof and outputs a low frequency reference signal in accordance with the reference voltage supplied to a drain terminal thereof, and a fourth transistor element that receives a local signal from the reference signal source with a gate terminal thereof and has a source terminal connected to a source terminal of the third transistor element and a drain terminal grounded. The calibration control circuit further includes an adder that adds a predetermined offset voltage to the detection signal.

A detection calibration circuit according to an eighth aspect is the detection calibration circuit according to the seventh aspect described above. The switcher includes a first matching circuit that matches impedance corresponding to the third high frequency signal and a second matching circuit that matches impedance corresponding to the reference signal and selects either the third high frequency signal or the reference signal in accordance with impedance matching in the first matching circuit or the second matching circuit.

A detection calibration circuit according to a ninth aspect is the detection calibration circuit according to the first aspect described above. The detection calibration circuit further includes a third distributor that distributes the second high frequency input signal into a fifth high frequency signal and a sixth high frequency signal and a second amplifier that amplifies the second high frequency input signal. The switcher selects the third high frequency signal, the sixth high frequency signal, or the reference signal of the reference signal generator.

A detection calibration circuit according to a tenth aspect includes a first amplifier, a first distributor, a second amplifier, a detector, a sensitivity switcher, and a calibration control circuit. The first amplifier amplifies a first high frequency input signal. The first distributor distributes the amplified first high frequency input signal into a second high frequency signal and a third high frequency signal. The second amplifier switches between a saturation operation and a linear operation in accordance with a plurality of different power supply voltages to amplify the third high frequency signal. The detector outputs a detection signal obtained by detecting the amplified third high frequency signal. The sensitivity switcher adjusts an input-output sensitivity for the detection signal. The calibration control circuit adjusts a detection gain of the detector, an input-output sensitivity for the detection signal, and the plurality of different power supply voltages of the second amplifier.

A transmission apparatus according to the first aspect includes a detection calibration circuit and a transmission antenna. The detection calibration circuit includes a first distributor, a first amplifier, a second distributor, a reference signal generator, a switcher, a detector, a sensitivity switcher, and a calibration control circuit. The first distributor distributes a first high frequency input signal into a first high frequency signal and a second high frequency signal. The first amplifier amplifies the first high frequency signal. The second distributor distributes the amplified first high frequency signal further into a third high frequency signal and a fourth high frequency signal. The reference signal generator uses the second high frequency signal to generate a reference signal in accordance with a switchable reference voltage. The switcher selects the third high frequency signal or the reference signal of the reference signal generator. The detector outputs a detection signal obtained by detecting the selected signal. The sensitivity switcher adjusts an input-output sensitivity for the detection signal. The calibration control circuit adjusts a detection gain of the detector and an input-output sensitivity for the detection signal. The transmission antenna transmits the fourth high frequency signal.

A transmission apparatus according to the second aspect includes a detection calibration circuit, a first transmission antenna, and a second transmission antenna. The detection calibration circuit includes a first distributor, a first amplifier, a second distributor, a reference signal generator, a detector, a sensitivity switcher, a calibration control circuit, a third distributor, a second amplifier, and a switcher. The first distributor distributes a first high frequency input signal into a first high frequency signal and a second high frequency signal. The first amplifier amplifies the first high frequency signal. The second distributor distributes the amplified first high frequency signal further into a third high frequency signal and a fourth high frequency signal. The reference signal generator uses the second high frequency signal to generate a reference signal in accordance with a switchable reference voltage. The detector outputs a detection signal obtained by detecting the selected signal. The sensitivity switcher adjusts an input-output sensitivity for the detection signal. The calibration control circuit adjusts a detection gain of the detector and an input-output sensitivity for the detection signal. The third distributor distributes a second high frequency input signal into a fifth high frequency signal and a sixth high frequency signal. The second amplifier amplifies the second high frequency input signal. The switcher selects the third high frequency signal, the sixth high frequency signal, or the reference signal of the reference signal generator. The first transmission antenna transmits the fourth high frequency signal. The second transmission antenna transmits the fifth high frequency signal.

A transmission apparatus according to the third aspect includes a detection calibration circuit and a transmission antenna. The detection calibration circuit includes a first amplifier, a first distributor, a second amplifier, a detector, a sensitivity switcher, and a calibration control circuit. The first amplifier amplifies the first high frequency input signal. The first distributor distributes the amplified first high frequency input signal into a second high frequency signal and a third high frequency signal. The second amplifier switches between a saturation operation and a linear operation in accordance with a plurality of different power supply voltages to amplify the third high frequency signal. The detector outputs a detection signal obtained by detecting the amplified third high frequency signal. The sensitivity switcher switches an input-output sensitivity for the detection signal. The calibration control circuit adjusts a detection gain of the detector, the input-output sensitivity for the detection signal and the plurality of different power supply voltages of the second amplifier. The transmission antenna transmits the second high frequency signal.

Various embodiments have been described above with reference to the drawings. Needless to say, however, the present disclosure is not limited to the embodiments described above. It is obvious that the skilled person could have arrived at various variations or modifications within the categories of claims. It is understood that those variations and modifications naturally fall within the technical scope of the present disclosure. Furthermore, each component in the embodiments described above may be optionally combined without departing from the spirits of the disclosures.

In each embodiment described above, an example has been described in which hardware is used in the structure. However, software may be used in conjunction with hardware to implement the present disclosure.

Furthermore, the functional blocks used in the explanations of various embodiments described above are implemented as LSI, which typically are integrated circuits. These may be made up of one chip individually, or may be integrated into one chip to include some or all. It should be noted that the LSI here may be referred to as IC, system LSI, super LSI, or ultra LSI depending on the degree of integration.

Furthermore, the method of circuit integration is not limited to LSI, but circuit integration may be implemented by using a dedicated circuit or a general processor. A field programmable gate array (FPGA) that is programmable after the production of LSI or a reconfigurable processor that can reconfigure a connection or a setting of circuit cells inside an LSI may be used.

Furthermore, when a new technique of circuit integration that replaces LSI has emerged due to advances of semiconductor technology and another technique derived therefrom, the technique naturally may be used to integrate the functional blocks. Application of biotechnology and other possibilities are thinkable.

The present disclosure is effective as a detection calibration circuit and a transmission apparatus that reduce fluctuations in a detected output voltage of a high frequency signal and suppress deterioration of the detection characteristic even when a temperature fluctuation, a power supply fluctuation, or aging is generated, in a detection circuit detecting the level of the high frequency signal transmitted.

What is claimed is:

1. A detection calibration circuit comprising:
   a first distributor that distributes a first high frequency input signal into a first high frequency signal and a second high frequency signal;
   a first amplifier that amplifies the first high frequency signal;
   a second distributor that distributes the amplified first high frequency signal further into a third high frequency signal and a fourth high frequency signal;
   a reference signal generator that uses the second high frequency signal to generate a reference signal in accordance with a switchable reference voltage;
   a switcher that selects the third high frequency signal or the reference signal of the reference signal generator;
   a detector that outputs a detection signal obtained by detecting the selected signal;
   a sensitivity switcher that adjusts an input-output sensitivity for the detection signal; and
   a calibration control circuit that adjusts a detection gain of the detector and an input-output sensitivity for the detection signal.

2. The detection calibration circuit according to claim 1, wherein the calibration control circuit further includes
   a bias controller that switches a bias voltage of the detector to one of a plurality of different bias voltages, and
   a sensitivity controller that switches an input-output sensitivity for the detection signal in the sensitivity switcher to one of a plurality of input and output sensitivities.

3. The detection calibration circuit according to claim 1, wherein the calibration control circuit further includes a reference voltage controller that switches a reference voltage of the reference signal generator to one of a plurality of reference voltages.

4. The detection calibration circuit according to claim 3, wherein the calibration control circuit further includes a detected voltage comparator that calculates the detection gain and the input-output sensitivity corresponding to the reference signal for each of the reference voltages, that compares between each of setting values of the detection gain and the input-output sensitivity corresponding to a desired input-output characteristic of the detector and each of calculated values of the detection gain and the input-output sensitivity, and that adjusts the detection gain and the input-output sensitivity in accordance with comparison results.

5. The detection calibration circuit according to claim 1, wherein
   the calibration control circuit further includes a mode determiner that determines either a detection mode for detecting the third high frequency signal or a calibration mode for adjusting the detection gain and the input-output sensitivity, and
   the switcher selects the third high frequency signal in the calibration mode and selects the reference signal in the detection mode.

6. The detection calibration circuit according to claim 1, wherein the reference signal generator includes
   a transformer that converts the second high frequency signal from a one-phase signal into a differential signal,
   a first transistor element that receives a first positive-phase high frequency output signal of the transformer with a gate terminal thereof and outputs the reference signal in accordance with the reference voltage supplied to a drain terminal thereof, and
   a second transistor element that receives a first negative-phase high frequency output signal of the transformer with a gate terminal thereof and has a source terminal connected to a source terminal of the first transistor element and a drain terminal grounded.

7. The detection calibration circuit according to claim 1, wherein
   the reference signal generator includes
      a reference signal source that outputs a local signal having a frequency lower than the second high frequency signal,
      a third transistor element that receives a local signal from the reference signal source with a gate terminal thereof and outputs a low frequency reference signal in accordance with the reference voltage supplied to a drain terminal thereof, and
      a fourth transistor element that receives a local signal from the reference signal source with a gate terminal thereof and has a source terminal connected to a source terminal of the third transistor element and a drain terminal grounded, and
   the calibration control circuit further includes an adder that adds a predetermined offset voltage to the detection signal.

8. The detection calibration circuit according to claim 7, wherein
   the switcher includes
      a first matching circuit that matches impedance corresponding to the third high frequency signal, and
      a second matching circuit that matches impedance corresponding to the reference signal, and
   selects either the third high frequency signal or the reference signal in accordance with impedance matching in the first matching circuit or the second matching circuit.

9. The detection calibration circuit according to claim 1, further comprising:
   a third distributor that distributes a second high frequency input signal into a fifth high frequency signal and a sixth high frequency signal; and
   a second amplifier that amplifies the second high frequency input signal, wherein
   the switcher selects the third high frequency signal, the sixth high frequency signal, or the reference signal of the reference signal generator.

* * * * *